US012777979B2

(12) United States Patent
Kim et al.

(10) Patent No.: US 12,777,979 B2
(45) Date of Patent: Oct. 27, 2026

(54) STACK-TYPE SEMICONDUCTOR PACKAGE WITH IMPROVED OPERATING STABILITY

(71) Applicant: Samsung Electronics Co., Ltd., Suwon-si (KR)

(72) Inventors: Minki Kim, Suwon-si (KR); Raeyoung Kang, Suwon-si (KR); Jihoon Kim, Suwon-si (KR); Jinkyeong Seol, Suwon-si (KR); Hyuekjae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 317 days.

(21) Appl. No.: 18/441,578

(22) Filed: Feb. 14, 2024

(65) Prior Publication Data

US 2024/0404970 A1 Dec. 5, 2024

(30) Foreign Application Priority Data

Jun. 1, 2023 (KR) ........................ 10-2023-0070949

(51) Int. Cl.
*H10W 90/00* (2026.01)
*H10W 20/41* (2026.01)
(Continued)

(52) U.S. Cl.
CPC .......... *H10W 90/00* (2026.01); *H10W 20/435* (2026.01); *H10W 72/926* (2026.01);
(Continued)

(58) Field of Classification Search
CPC . H10W 90/00; H10W 90/297; H10W 90/724; H10W 90/722; H10W 90/792;
(Continued)

(56) References Cited

U.S. PATENT DOCUMENTS 9,793,246 B1 * 10/2017 Tseng .................... H10W 70/09
10,283,448 B2 5/2019 Liu et al.
(Continued)

FOREIGN PATENT DOCUMENTS

CN 107256852 B 9/2019
EP 3173910 B1 * 3/2018 ....... G02F 1/133512
(Continued)

*Primary Examiner* — Sheng-Bai Zhu
(74) *Attorney, Agent, or Firm* — Wolf, Greenfield & Sacks, P.C.

(57) ABSTRACT

A semiconductor package includes a first die having signal and dummy regions, and a second die on the first die. The first die includes first dummy patterns arranged in a first direction on the dummy region, second dummy patterns on the dummy region and between the first dummy patterns, a first dielectric layer on the first and second dummy patterns, and first pads extending through the first dielectric layer and coupled to the first dummy patterns. The second die includes second pads on the dummy region, and third pads on the dummy region. On an interface between the first and second dies, the first pads are in contact with the second pads. The first dielectric layer is between the second dummy patterns and the third pads. The first dummy patterns are connected to a ground circuit or power circuit of the first die.

20 Claims, 31 Drawing Sheets

(51) Int. Cl.

| | |
|---|---|
| ***H10W 72/90*** | (2026.01) |
| ***H10W 74/15*** | (2026.01) |
| ***H10W 80/00*** | (2026.01) |
| ***H10W 90/20*** | (2026.01) |

(52) U.S. Cl.
CPC ...... *H10W 72/9445* (2026.01); *H10W 72/967* (2026.01); *H10W 74/15* (2026.01); *H10W 80/721* (2026.01); *H10W 80/743* (2026.01); *H10W 90/297* (2026.01); *H10W 90/722* (2026.01); *H10W 90/724* (2026.01); *H10W 90/734* (2026.01); *H10W 90/792* (2026.01)

(58) Field of Classification Search
CPC ............. H10W 90/734; H10W 72/967; H10W 72/926; H10W 74/15; H10W 20/435
USPC ........................................................... 257/773
See application file for complete search history.

(56) References Cited

U.S. PATENT DOCUMENTS

| | | | | |
|---|---|---|---|---|
| 10,672,820 | B2 | 6/2020 | Tsai | |
| 11,362,069 | B2 | 6/2022 | Chen et al. | |
| 11,393,781 | B2 | 7/2022 | Watanabe | |
| 11,621,239 | B2 | 4/2023 | Uozumi | |
| 2008/0283961 | A1* | 11/2008 | Tomita | H10W 10/0143 257/E21.244 |
| 2011/0278739 | A1* | 11/2011 | Lai | H10W 70/635 257/E23.141 |
| 2012/0038057 | A1* | 2/2012 | Bartley | H10W 20/20 257/E23.174 |
| 2016/0050744 | A1* | 2/2016 | Lee | H05K 1/0206 361/712 |
| 2021/0005576 | A1* | 1/2021 | Kim | H10W 20/20 |
| 2021/0118832 | A1* | 4/2021 | Chen | H03K 19/1776 |
| 2021/0296615 | A1* | 9/2021 | Lee | H10K 59/12 |
| 2022/0165721 | A1 | 5/2022 | Lee et al. | |
| 2022/0293566 | A1* | 9/2022 | Park | H10W 74/012 |
| 2023/0035032 | A1 | 2/2023 | Kim et al. | |
| 2023/0369263 | A1* | 11/2023 | Chuang | H10W 40/10 |

FOREIGN PATENT DOCUMENTS

| | | | |
|---|---|---|---|
| JP | 2008066716 | * | 3/2008 |
| KR | 101474636 | B1 | 12/2014 |
| KR | 20190125887 | * | 11/2019 |
| KR | 20220027535 | * | 3/2022 |

* cited by examiner

STACK-TYPE SEMICONDUCTOR PACKAGE WITH IMPROVED OPERATING STABILITY

CROSS-REFERENCE TO RELATED APPLICATION

This U.S. nonprovisional application claims priority under 35 U.S.C § 119 to Korean Patent Application No. 10-2023-0070949, filed on Jun. 1, 2023, in the Korean Intellectual Property Office, the disclosure of which is hereby incorporated by reference in its entirety.

BACKGROUND

The present inventive concepts relate to a semiconductor package, and more particularly, to a multi-chip semiconductor package including a through electrode.

The development of the electronics industry may provide low price electronic products having characteristics, such as light weight, compact size, high speed, and high performance. A semiconductor package is provided to implement an integrated circuit chip that may be used in electronic products. Various research has been undertaken to enhance the performance of the semiconductor package. In particular, through silicon via (TSV) technology has been identified as an option for facilitating the performance needed in a semiconductor package where wire bonding technology is used.

A stack-type multi-chip semiconductor package uses a circuit layer, a through electrode, a solder bump, and/or a gap fill to stack chips on each other. An increase in the number of stacked chips may induce an increase in an amount of the circuit chip and the gap fill between the chips, and may also induce degradation of the chips.

SUMMARY

Some embodiments of the present inventive concepts may provide a semiconductor package with improved heat radiation.

Some embodiments of the present inventive concepts may provide a semiconductor package with improved structural stability.

Some embodiments of the present inventive concepts may provide a semiconductor package with improved electrical properties and operating stability.

According to some embodiments of the present inventive concepts, a semiconductor package may comprise: a first die having a signal region and a dummy region that surrounds the signal region in a plan view of the semiconductor package; and a second die stacked on the first die. The first die may include: a plurality of first dummy patterns arranged in a first direction on the dummy region; a plurality of second dummy patterns on the dummy region and arranged in the first direction between the first dummy patterns; a first dielectric layer on the first dummy patterns and the second dummy patterns; and a plurality of first pads that extend through the first dielectric layer and are coupled to the first dummy patterns. The second die may include: a plurality of second pads on the dummy region at positions that correspond to positions of the first dummy patterns; and a plurality of third pads on the dummy region at positions that correspond to positions of the second dummy patterns. On an interface between the first die and the second die, the first pads may contact the second pads. The first dielectric layer may be between the second dummy patterns and the third pads. The first dummy patterns may be connected to a ground circuit or a power circuit of the first die.

According to some embodiments of the present inventive concepts, a semiconductor package may comprise: a first die having a signal region and a dummy region that surrounds the signal region in a plan view of the semiconductor package; and a second die stacked on the first die. The first die may include: a plurality of first dummy patterns and a plurality of second dummy patterns that extend in a first direction on the dummy region and are alternately arranged in a second direction that intersects the first direction; a first dielectric layer on the first dummy patterns and the second dummy patterns; a plurality of first pads on the first dummy patterns; and a plurality of second pads on the second dummy patterns. The second die may include: a plurality of third pads on the dummy region at positions that correspond to positions of the first pads; and a plurality of fourth pads at positions that correspond to positions of the second pads. The third pads may be electrically connected through the first pads to the first dummy patterns. The fourth pads may be electrically insulated from the second dummy patterns.

According to some embodiments of the present inventive concepts, a semiconductor package may comprise: a substrate; a first die on the substrate and having a signal region and a dummy region that surrounds the signal region in a plan view of the semiconductor package; a second die stacked on the first die; and a molding layer on the substrate and surrounding the first die and the second die. The first die may include: a plurality of first dummy patterns and a plurality of second dummy patterns that are alternately arranged in a first direction on the dummy region; a first dielectric layer on the first dummy patterns and the second dummy patterns; a plurality of first pads that are arranged to constitute at least one row that extends along a second direction on the first dummy patterns, the second direction intersecting the first direction; and a plurality of second pads that are arranged to constitute one row that extends along the second direction on the second dummy patterns. The second die may include: a plurality of third pads on the dummy region and at positions that correspond to positions of the first pads; and a plurality of fourth pads at positions that correspond to positions of the second pads. The first pads may be in contact with the second pads and the first dummy patterns. The first dielectric layer may be between the fourth pads and the second pads or between the second pads and the second dummy patterns. The first dummy patterns may be connected to a ground circuit or a power circuit of the first die.

BRIEF DESCRIPTION OF DRAWINGS

FIGS. 9A to 11A are cross-sectional views of section K depicted in FIG. 8, illustrating a method of fabricating a semiconductor package according to some embodiments of the present inventive concepts.

FIGS. 9B to 11B are enlarged views illustrating section L of FIGS. 9A to 11A, respectively.

FIGS. 15A to 22A are cross-sectional views of section K depicted in FIG. 8, illustrating a method of fabricating a semiconductor package according to some embodiments of the present inventive concepts.

FIGS. 15B to 22B are enlarged views illustrating section L of FIGS. 15A to 22A, respectively.

DETAILED DESCRIPTION OF EMBODIMENTS

Figure 1:
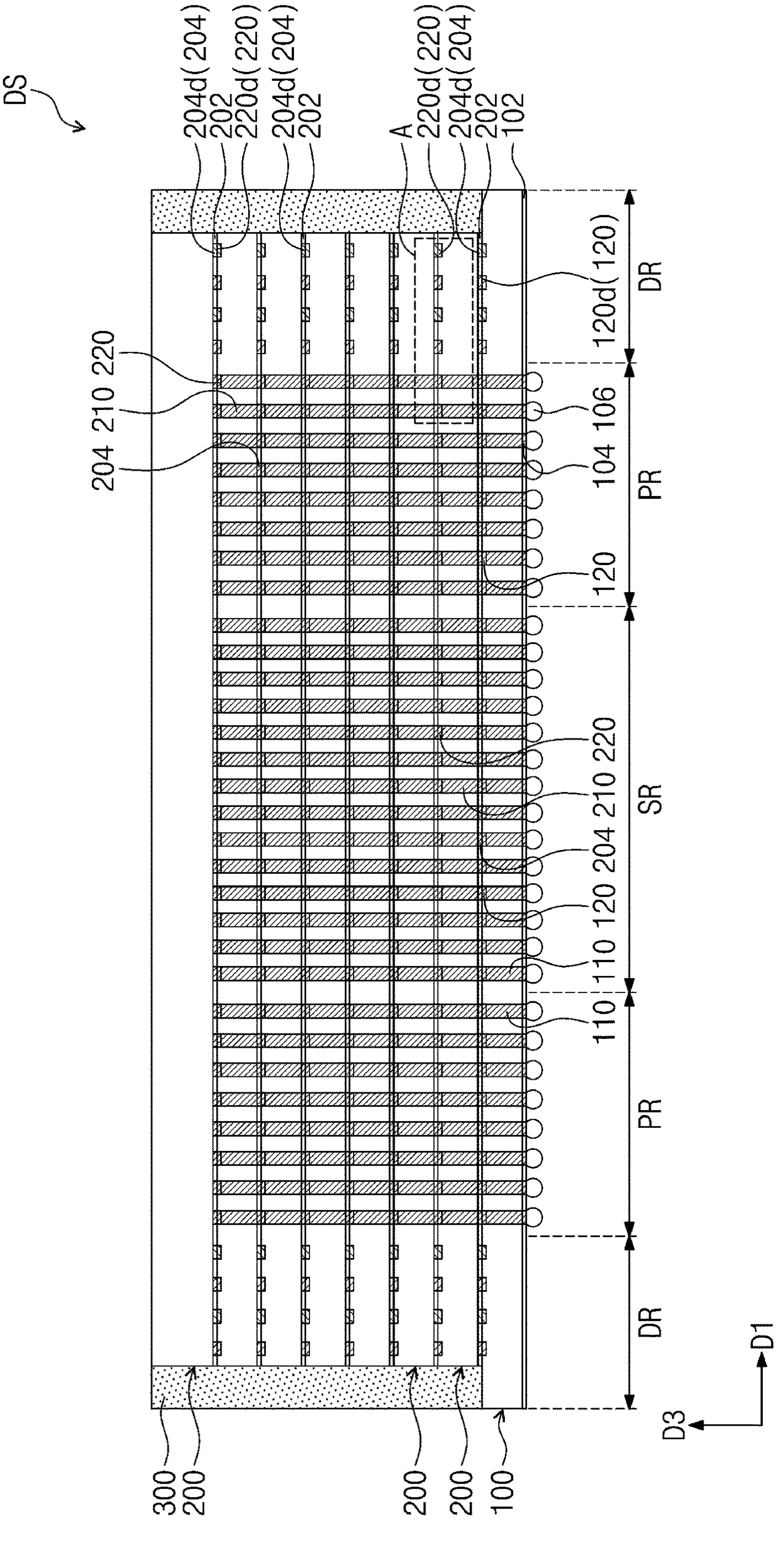
FIG. 1 is a cross-sectional view illustrating a semiconductor package according to some embodiments of the present inventive concepts.

Hereinafter, embodiments of the inventive concept will be described as follows with reference to the accompanying drawings in which example embodiments of the inventive concept are shown. The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Figure 2A:
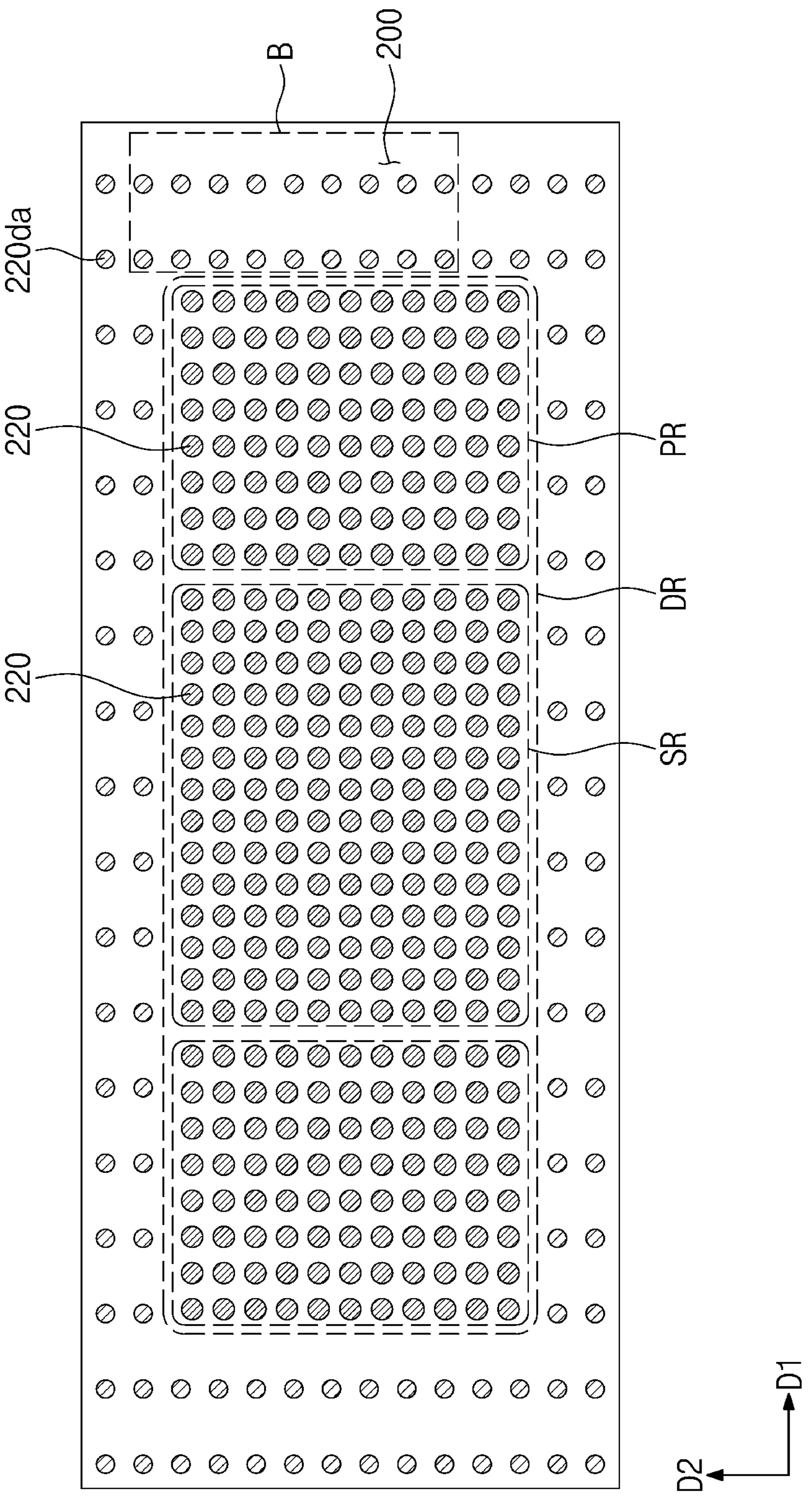
FIG. 2A is a plan view illustrating a semiconductor package according to some embodiments of the present inventive concepts.
Figure 2B:
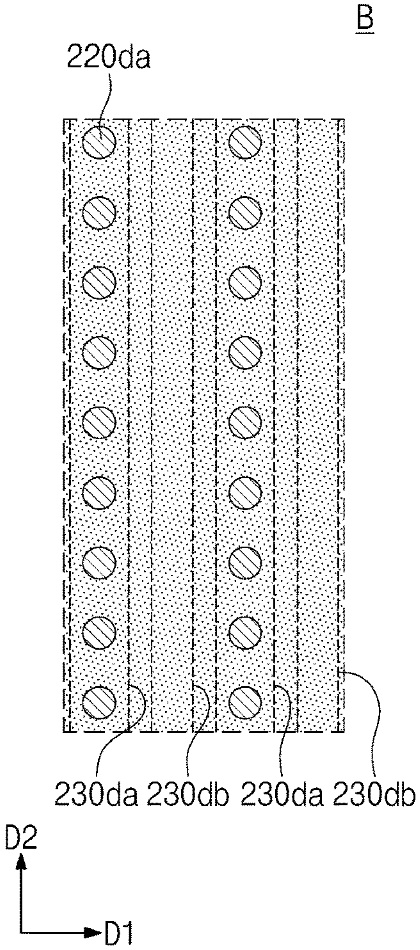
FIG. 2B is an enlarged view illustrating section B of FIG. 2A.
Figure 2C:
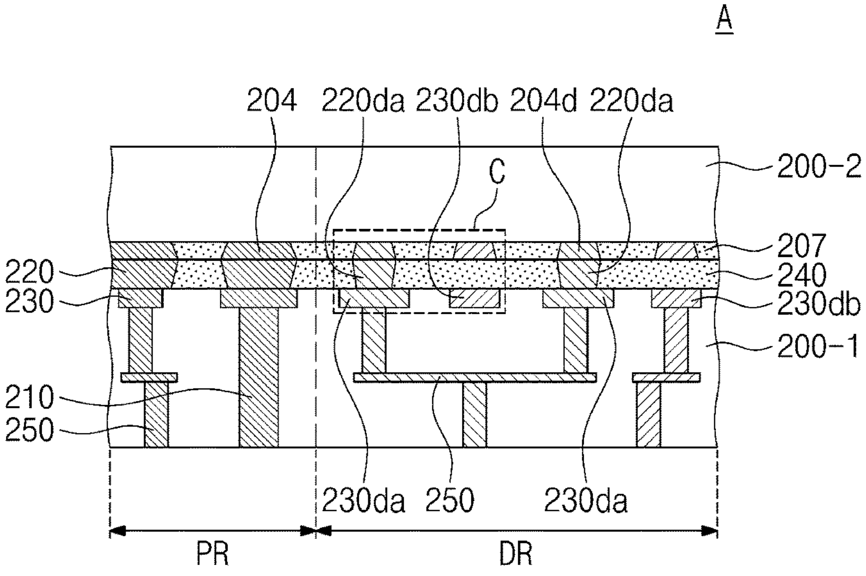
FIG. 2C is an enlarged view illustrating section A of FIG. 1.
Figure 2D:
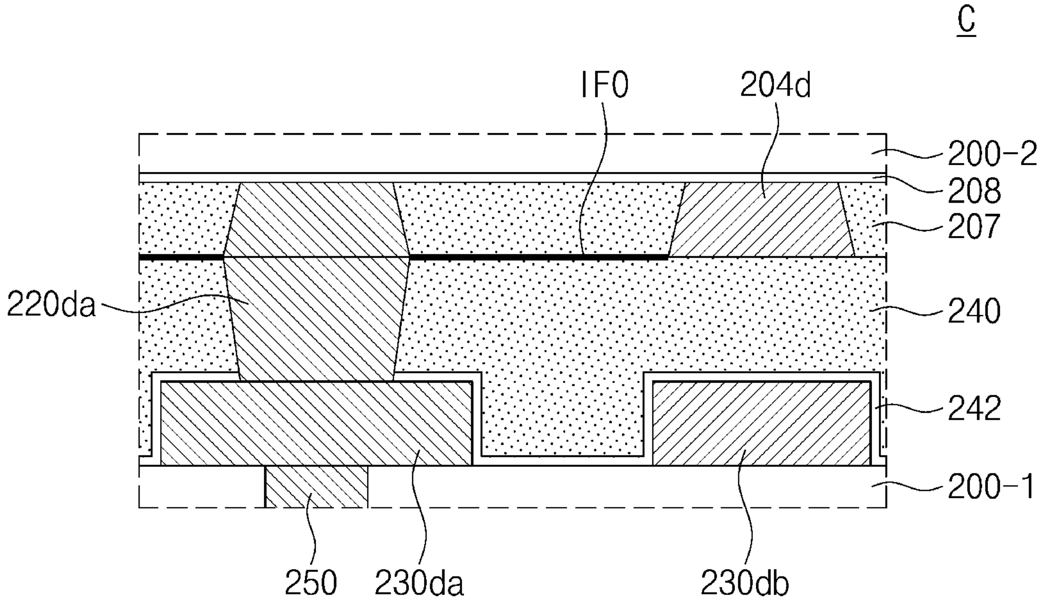
FIG. 2D is an enlarged view illustrating section C of FIG. 2C.

FIG. 1 is a cross-sectional view illustrating a semiconductor package according to some embodiments of the present inventive concepts. FIG. 2A is a plan view of a top surface of a second die, illustrating a semiconductor package according to some embodiments of the present inventive concepts. FIG. 2B is an enlarged view illustrating section B of FIG. 2A. FIG. 2C is an enlarged view illustrating section A of FIG. 1. FIG. 2D illustrates an enlarged view showing section C of FIG. 2C.

In this description below, a first direction D1 and a second direction D2 are defined to be parallel to a top surface of a base substrate 100 while being orthogonal to each other, and a third direction D3 is defined to be perpendicular to the top surface of the base substrate 100. The D3 direction may also be referred to as a vertical direction.

Referring to FIGS. 1 and 2A to 2D, a semiconductor package according to some embodiments of the present inventive concepts may be a stack-type package in which a via is used. For example, second dies 200 of the same type may be stacked on the base substrate 100, and the second dies 200 may be electrically connected to each other through second vias 210 that extend through or penetrate the second dies 200. The second dies 200 may be directly bonded and electrically connected to each other.

The base substrate 100 may be provided. The base substrate 100 may include an integrated circuit therein. For example, the base substrate 100 may be a first die that includes an electronic device, such as a transistor. For example, the base substrate 100 may be a wafer-level semiconductor die formed of a semiconductor, such as silicon (Si). FIG. 1 shows that the base substrate 100 is a first die, but the present inventive concepts are not limited thereto. According to some embodiments of the present inventive concepts, the base substrate 100 may be a substrate that does not include an electronic device, such as a transistor. The following will describe an example in which the base substrate 100 and the first die 100 are the same component.

When viewed in plan, the first die 100 may include a signal region SR and peripheral regions PR positioned on a central portion of the first die 100, and may also include a dummy region DR that borders and at least partially surrounds the signal region SR and the peripheral regions PR. The signal region SR may extend in the first direction D1. The signal region SR may be a zone on which are provided wiring lines for signals that are processed in the integrated circuit in the first die 100. The peripheral regions PR may be a zone on which are provided wiring lines for various signals (e.g., a power signal and a ground signal) used for driving the integrated circuit in the first die 100. The peripheral regions PR may be disposed in the first direction D1 from the signal region SR. The present inventive concepts, however, are not limited thereto, and a plurality of signal regions SR and peripheral regions PR may be provided or disposed in various ways inside the dummy region DR. The dummy region DR may include no wiring lines electrically connected to the integrated circuit in the first die 100. The dummy region DR may border and at least partially surround the signal region SR and the peripheral regions PR in a plan view. The present inventive concepts, however, are not limited thereto, and the signal region SR, the peripheral regions PR, and the dummy region DR may be arranged in various ways, if necessary. For example, a zone including the signal region SR and the peripheral regions PR may extend in the first direction D1 across the first die 100, and the dummy regions DR may be disposed on opposite sides of the zone. In this case, the dummy regions DR may extend in the first direction D1. For example, the signal region SR and the peripheral regions PR may extend in the first direction D1 between (or inside) the peripheral regions PR. The following description will focus on the embodiment of FIG. 2A.

The first die 100 may include a first circuit layer 102 and first vias 110.

The first circuit layer 102 may be provided on a bottom surface of the first die 100. The first circuit layer 102 may include the integrated circuit. For example, the first circuit layer 102 may include a logic circuit. For another example, the first circuit layer 102 may include a memory circuit, a passive device, or a logic circuit with a combination thereof. The bottom surface of the first die 100 may be an active surface of the first die 100.

The first vias 110 may extend or penetrate in the third direction D3 through the first die 100. The first vias 110 may be electrically connected to the first circuit layer 102. The first vias 110 may include signal vias provided on the signal region SR and power/ground vias provided on the peripheral regions PR. For example, the signal vias of the first vias 110 may be electrically connected to the integrated circuit of the first die 100. The power/ground vias of the first vias 110 may be electrically connected to a power circuit or ground circuit of the first die 100. The first vias 110 may be arranged along the first direction D1 and the second direction D2. For example, the first vias 110 may be disposed in a grid shape. In other embodiments, the first vias 110 may be arranged in rows, which rows may be shifted from each other in the first direction D1 or the second direction D2. The first vias 110 may be disposed in a zigzag shape along the first direction D1 or the second direction D2. In other embodiments, the first vias 110 may be arranged in a honeycomb shape.

The first die 100 may include first upper pads 120 disposed on the top surface of the first die 100. The first upper pads 120 may include first upper signal pads provided on the signal region SR, first upper power/ground pads provided on the peripheral regions PR, and first upper dummy pads 120*d* provided on the dummy region DR. The first upper pads 120 may be coupled to the first vias 110. For example, the first upper signal pads of the first upper pads 120 may be coupled to the signal vias 110 on the signal region SR, and the first upper power/ground pads of the first upper pads 120 may be coupled to the power/ground vias 110 on the peripheral regions PR. The first upper dummy pads 120*d* may be provided on the dummy region DR, and may be electrically insulated from the first vias 110. In addition, the first upper dummy pads 120*d* may be electrically insulated from the first circuit layer 102. The first upper pads 120 may have a circular planar shape. On the signal region SR and the peripheral regions PR, an arrangement of the first upper pads 120 may conform to that of the first vias 110. For example, on the signal region SR and the peripheral regions PR, the first upper pads 120 may be arranged along the first direction D1 and the second direction D2.

The first die 100 may include first lower pads 104 disposed on the bottom surface of the first die 100. The first lower pads 104 may be coupled to the first circuit layer 102 or the first vias 110. The first lower pads 104 may be exposed on a bottom surface of the first circuit layer 102.

The first die 100 may include external terminals 106. The external terminals 106 may be provided on the bottom surface of the first die 100. The external terminals 106 may be coupled to the first lower pads 104. In other embodiments, the first die 100 may not have the first lower pads 104. In this case, the external terminals 106 may be provided on bottom surfaces of the first vias 110 exposed on the bottom surface of the first circuit layer 102. The external terminals 106 may be electrically connected to the first circuit layer 102 and the first vias 110.

Although not shown, the first die 100 may further include a protection layer. The protection layer may be disposed on the bottom surface of the first die 100 to be on and at least partially cover the first circuit layer 102. The protection layer may protect the first circuit layer 102. The first lower pads 104 may be exposed on a bottom surface of the protection layer. The protection layer may include silicon nitride (SiN). The protection layer may expose the external terminals 106.

A die stack DS may be disposed on the first die 100. The die stack DS may include the second dies 200 stacked on the first die 100. The following description is based on a single second die 200 configuration of the second dies 200.

The second die 200 may be provided. The second die 200 may include an electronic device, such as a transistor. For example, the second die 200 may be a wafer-level semiconductor die formed of a semiconductor such as silicon (Si). The second die 200 may have a width less than that of the first die 100.

When viewed in plan, the second die 200 may include a signal region SR and peripheral regions PR positioned on a central portion of the second die 200, and may also include a dummy region DR that borders and at least partially surrounds the signal region SR and the peripheral regions PR. The signal region SR, the peripheral regions PR, and the dummy region DR of the second die 200 may respectively correspond to the signal region SR, the peripheral region PR, and the dummy region DR of the first die 100. For example, the signal region SR, the peripheral regions PR, and the dummy region DR of the second die 200 may have their shapes that are respectively substantially the same as those of the signal region SR, the peripheral regions PR, and the dummy region DR of the first die 100. In this description below, sections of the second die 200 that are designated by the same terms used for corresponding sections of the first die 100 will indicate the same sections to which the corresponding sections of the first die 100 are projected.

The second die 200 may include a second circuit layer 202 and second vias 210. An uppermost second die 200 of the die stack DS may not include the second vias 210.

The second circuit layer 202 may be provided on a bottom surface of the second die 200. The second circuit layer 202 may include an integrated circuit. For example, the second circuit layer 202 may include a memory circuit. In other embodiments, the second circuit layer 202 may include a logic circuit, a passive device, or a memory circuit with a combination thereof. The bottom surface of the second die 200 may be an active surface of the second die 200.

The second vias 210 may extend or penetrate in the third direction D3 through the second die 200. The second vias 210 may be electrically connected to the second circuit layer 202. The second vias 210 may have substantially the same configuration and arrangement as those of the first vias 110. The second vias 210 may include signal vias provided on the signal region SR and power/ground vias provided on the peripheral regions PR. For example, when viewed in plan, an arrangement of the signal vias and the power/ground vias of the second vias 210 may be substantially the same as that of the signal vias and the power/ground vias of the first vias 110. The signal vias of the second vias 210 may be electrically connected to the integrated circuit of the second die 200. The power/ground vias of the second vias 210 may be electrically connected to a power circuit or a ground circuit of the second die 200. The second vias 210 may be arranged along the first direction D1 and the second direction D2. For example, the second vias 210 may be disposed in a grid shape. In other embodiments, the second vias 210 may be arranged in rows, which rows may be shifted from each other in the first direction D1 or the second direction D2. The second vias 210 may be disposed in a zigzag shape along the first direction D1 or the second direction D2. In other embodiments, the second vias 210 may be arranged in a honeycomb shape.

The second die 200 may include second upper pads 220 disposed on a top surface of the second die 200. The second upper pads 220 may include second upper signal pads provided on the signal region SR, second upper power/ground pads provided on the peripheral regions PR, and second upper dummy pads 220*d* provided on the dummy region DR. The second upper pads 220 may have a circular planar shape, a rectangular planar shape, or a polygonal planar shape. A width of the second upper pads 220 may increase with increasing distance from the top surface of the second die 200. In other embodiments, differently from that shown, the width of the second upper pads 220 may be uniform. The uppermost second die 200 of the die stack DS may not include the second upper pads 220.

The second upper pads 220 may be electrically connected to the second vias 210. For example, the second upper signal pads of the second upper pads 220 may be electrically connected to the signal vias 210 on the signal region SR, and may be electrically connected through the signal vias 210 to the integrated circuit of the second die 200. For example, the second power/ground pads of the second upper pads 220 may be electrically connected to the power/ground vias 210 on the peripheral regions PR, and may be electrically connected through the second power/ground vias 210 to the power circuit and the ground circuit of the second die 200. The second upper dummy pads 220*d* may be provided on the dummy region DR, and may be electrically insulated from the second vias 210. In addition, the second upper dummy pads 220*d* may be electrically insulated from the integrated circuit of the second die 200, and each of the second upper dummy pads 220*d* may be connected to one of the power circuit and the ground circuit of the second die 200. The second upper pads 220 may have a circular planar shape. On the signal region SR and the peripheral regions PR, an arrangement of the second upper pads 220 may conform to that of the second vias 210. For example, on the signal region SR and the peripheral regions PR, the second upper pads 220 may be arranged along the first direction D1 and the second direction D2. With reference to FIGS. 2B to 2D, the following will focus on a detailed description of an arrangement and electrical connection of the second upper dummy pads 220*d*.

FIGS. 2C and 2D depict two second dies 200-1 and 200-2 that are vertically bonded, and for convenience of description, the second die 200-1 may indicate a second die located at a lower position and the second die 200-2 may indicate a second die located at an upper position in the D3 direction. In addition, FIG. 2C depicts a simplified arrangement and shape of an upper dielectric layer 240, wiring patterns 230, and second upper pads 220, but the present inventive concepts are not limited thereto. A detailed arrangement and shape of the upper dielectric layer 240, the wiring patterns 230, and the second upper pads 220 will be discussed with reference to FIG. 2D.

Referring to FIGS. 2B to 2D, the wiring patterns 230 may be disposed on the second dies 200-1 and 200-2. The wiring patterns 230 may be disposed on top surfaces of the second dies 200-1 and 200-2. FIG. 2D shows that the wiring patterns 230 are disposed on the top surface of the second die 200, but the present inventive concepts are not limited thereto. According to some embodiments, the wiring patterns 230 may be buried in an upper portion of the second die 200, and top surfaces of the wiring patterns 230 may be exposed on the top surface of the second die 200.

The wiring patterns 230 may include signal patterns provided on the signal region SR, power/ground patterns provided on the peripheral regions PR, and dummy patterns 230*da* and 230*db* provided on the dummy region DR.

The wiring patterns 230 may be electrically connected to the second vias 210. For example, the signal patterns of the wiring patterns 230 may be coupled to the signal vias 210 on the signal region SR, and may be electrically connected through the signal vias 210 to the integrated circuit of the second die 200. For example, the power/ground patterns of the wiring patterns 230 may be coupled to the power/ground vias 210 on the peripheral regions PR, and may be electrically connected through the power/ground vias 210 to the integrated circuit and the ground circuit of the second die 200. In other embodiments, the signal patterns and the power/ground patterns may be respectively electrically connected to the integrated circuit and the power/ground circuit of the second die 200 through vertical wiring lines 250 formed in the second die 200.

The dummy patterns 230*da* and 230*db* may be provided on the dummy region DR and electrically to the power circuit or the ground circuit of the second die 200 through the vertical wiring lines 250 formed in the second die 200. The dummy patterns 230*da* and 230*db* may include first dummy patterns 230*da* connected to the power circuit and second dummy patterns 230 *db* connected to the ground circuit. In other embodiments, the dummy patterns 230*da* and 230*db* may be electrically connected to the power circuit or the ground circuit through vias that vertically extend into or penetrate the second die 200.

The dummy patterns 230*da* and 230*db* may have a linear shape that extends in the second direction D2. The first dummy patterns 230*da* and the second dummy patterns 230*db* may be alternately positioned along the first direction D1. For example, when viewed in the first direction D1, one second dummy pattern 230*db* may be disposed between the first dummy patterns 230*da*, and one first dummy pattern 230*da* may be disposed between the second dummy patterns 230*db*. When viewed in the first direction D1, a width of the first dummy patterns 230*da* may be greater than that of the second dummy patterns 230*db* as shown in FIG. 2D. The present inventive concepts, however, are not limited thereto, and the width of the first dummy patterns 230*da* may be the same as or less than that of the second dummy patterns 230*db*.

The upper dielectric layer 240 may be provided on the top surface of the second die 200. For example, as shown in FIGS. 2C and 2D, the second die 200 may be provided on its top surface with an upper barrier pattern 242 that conformally covers the wiring patterns 230 and the top surface of the second die 200 and with the upper dielectric layer 240 that covers the upper barrier pattern 242. The upper barrier pattern 242 and the upper dielectric layer 240 may include a dielectric material such as silicon oxide (SiO), silicon nitride (SiN), and/or silicon oxynitride (SiON). In other embodiments, the upper barrier pattern 242 and the upper dielectric layer 240 may include a photosensitive polymer or a dielectric polymer.

The second upper pads 220 may be provided on the top surface of the second die 200. For example, the second upper pads 220 may be provided on the wiring patterns 230. The second upper pads 220 may vertically extend through or penetrate the upper dielectric layer 240 and the upper barrier pattern 242 to be coupled to the top surfaces of the wiring patterns 230. A top surface of the upper dielectric layer 240 may be substantially coplanar with those of the second upper pads 220.

The second upper pads 220 may be electrically connected to the wiring patterns 230. For example, the second upper signal pads of the second upper pads 220 may be coupled to the signal patterns on the signal region SR. The power/ground patterns of the second upper pads 220 may be coupled to the second power/ground pads on the peripheral regions PR. In other embodiments, the second upper signal pads and the second power/ground pads may be respectively electrically connected through the wiring patterns 230 to the integrated circuit and the power/ground circuit of the second die 200.

The second upper dummy pads **220*d* may be coupled to the dummy patterns 230*da* and 230*db*. For example, the second upper dummy pads 220*d* may include power pads 220*da* provided on the first dummy patterns 230*da*. The second upper dummy pads 220*d* may not be provided on the second dummy patterns 230*db*. For example, no pads for electrical connection may be separately provided on the second dummy patterns 230*db*. The power pads 220*da* may be coupled to top surfaces of the first dummy patterns 230*da*. On one first dummy pattern 230*da*, the power pads 220*da* may be arranged in the second direction D2. For example, the power pads 220*da* may be arranged to constitute a plurality of rows that are disposed along the first direction D1, and each row of the power pads 220*da* may be located on one first dummy pattern 230*da*. For example, a one-to-one correspondence may be established between the rows of the power pads 220*da* and the first dummy patterns 230*da*. An interval in the first direction between the power pads 220*da*, or an interval between the rows of the power pads 220*da***, may be in a range of about 3 micrometers to about 30 micrometers.

According to some embodiments of the present inventive concepts, the second upper dummy pads **220*d* and the dummy patterns 230*da* and 230*db* may be provided on the dummy region DR. Therefore, even on the dummy region DR that corresponds to an outer portion of the second die 200, heat may be thermally radiated through the second upper dummy pads 220*d* and the dummy patterns 230*da* and 230*db*. In addition, the power pads 220*da* and the first dummy patterns 230*da* may be electrically connected to the power circuit of the second die 200, and the power pads 220*da*** may be used as test pads.

The second die 200 may include second lower pads 204 disposed on the bottom surface of the second die 200. The second lower pads 204 may include second lower signal pads provided on the signal region SR, second lower power/ground pads provided on the peripheral regions PR, and second lower dummy pads **204*d* provided on the dummy region DR. A planar arrangement and shape of the second lower pads 204 may be substantially the same as or similar to that of the second upper pads 220. For example, the second lower signal pads may be disposed on positions that correspond to those of the second upper signal pads on the signal region SR, and the second lower power/ground pads may be disposed on positions that correspond to those of the second upper power/ground pads on the peripheral regions PR. One or more of the second lower dummy pads 204*d* may be disposed on positions that correspond to those of the second upper dummy pads 220*d* on the dummy region DR or those of the power pads 220*da* on the dummy region DR. Other ones of the second lower dummy pads 204*d* may be disposed on positions that correspond to those of the second dummy patterns 230*db*** on the dummy region DR.

The second lower dummy pads **204*d* may be arranged to constitute a plurality of rows that are disposed along the first direction D1. Each row of the second lower dummy pads 204*d* may be disposed on a position that corresponds to that of one first dummy pattern 230*da* or that of one second dummy pattern 230*db*. The second lower dummy pads 204*d* may have a circular planar shape, a rectangular planar shape, or a polygonal planar shape. A width of the second lower dummy pads 204*d* may increase with increasing distance from the bottom surface of the second die 200. In other embodiments, differently from that shown, the width of the second lower dummy pads 204*d* may be uniform. The second lower dummy pads 204*d* may be electrically floated in the second die 200. For example, the second lower dummy pads 204*d* may be electrically insulated from the second circuit layer 202 of the second die 200**.

A lower dielectric layer 207 may be provided on the bottom surface of the second die 200. For example, as shown in FIGS. 2C and 2D, the second die 200 may be provided on its bottom surface with a lower barrier pattern 208 that is on and at least partially covers the bottom surface of the second die 200 and the lower dielectric layer 207 that is on and at least partially covers the lower barrier pattern 208. For convenience of description, the second circuit layer 202 is omitted in FIGS. 2C and 2D, but the second circuit layer 202 may be positioned between the lower barrier pattern 208 and the bottom surface of the second die 200. For example, the lower barrier pattern 208 may conformally at least partially cover a bottom surface of the second circuit layer 202. The second lower pads 204 may be provided on a bottom surface of the lower barrier pattern 208, and the second lower pads 204 may vertically extend into or penetrate the lower dielectric layer 207. A bottom surface of the lower dielectric layer 207 may be substantially coplanar with those of the second lower pads 204. The lower barrier pattern 208 and the lower dielectric layer 207 may include a dielectric material such as silicon oxide (SiO), silicon nitride (SiN), and/or silicon oxynitride (SiON). In other embodiments, the lower dielectric layer 207 on and at least partially covering the lower barrier pattern 208 and the lower barrier pattern 208 may include a photosensitive polymer or a dielectric polymer.

Referring back to FIGS. 1 and 2A to 2D, neighboring second dies 200 may be connected to each other. For example, the second dies 200 may be vertically stacked on the first die 100. The second upper pads 220 of a certain second die 200 may be vertically aligned with the second lower pads 204 of another second die 200 adjacent to the certain second die 200. The adjacent second dies 200 may be bonded to each other.

Referring to FIGS. 2C and 2D, the second die 200-1 positioned at a lower position with respect to the vertical direction D3 may be connected to the second die 200-2 positioned at an upper position. For example, the lower second die 200-1 may be bonded to the upper second die 200-2. On an interface between the lower second die 200-1 and the upper second die 200-2, the second upper pads 220 of the lower second die 200-1 may be bonded to the second lower pads 204 of the upper second die 200-2. In this case, the second upper pads 220 and the second lower pads 204 may constitute an intermetallic hybrid bonding. In this description, the term "hybrid bonding" may denote a bonding in which two components of the same kind are merged at an interface therebetween. For example, the second upper pad 220 and the second lower pad 204 to which it is bonded may have a continuous configuration, and an invisible interface may be present between the second upper pad 220 and the second lower pad 204. The second upper pad 220 and the second lower pad 204 may be formed of the same material and may have no interface therebetween. Therefore, the second upper pad 220 and the second lower pad 204 may be provided in the form of one component. For example, the second upper pad 220 and the second lower pad 204 may be combined to constitute a single unitary or monolithic piece.

On the signal region SR, the signal pads of the second upper pads 220 may be bonded to the signal pads of the second lower pads 204. On the peripheral regions PR, the power/ground pads of the second upper pads 220 may be bonded to the power/ground pads of the second lower pads 204. On the dummy region DR, the second upper dummy pads 220*d*, or the power pads 220*da*, of the second upper pads 220 may be bonded to the second lower dummy pads 204*d* of the second lower pads 204. The second upper dummy pads 220*d* may not be provided below ones of the second lower dummy pads 204*d* positioned on the second dummy patterns 230*db*, and the ones of the second lower dummy pads 204*d* may be in contact with the top surface of the upper dielectric layer 240 included in the lower second die 200-1.

According to some embodiments of the present inventive concepts, on the dummy region DR that corresponds to an outer portion of the second die 200, the second upper dummy pads 220*d* may be bonded to the second lower dummy pads 204*d*. Therefore, the lower second die 200-1 and the upper second die 200-2 may be strongly bonded to each other, and the semiconductor package may increase in structural stability.

The upper dielectric layer 240 of the lower second die 200-1 may be in contact with the lower dielectric layer 207 of the upper second die 200-2. An impurity layer IFO may be interposed between the upper dielectric layer 240 and the lower dielectric layer 207. The impurity layer IFO may include impurities present on an interface between the upper dielectric layer 240 and the lower dielectric layer 207. The impurities may include a metallic material that constitutes the second upper pads 220 or the second lower pads 204. For example, the impurity layer IFO may be formed by contamination of a surface of the upper dielectric layer 240 or the lower dielectric layer 207 caused by the metallic material that constitutes the second upper pads 220 or the second lower pads 204 in a process where the second dies 200-1 and 200-2 are fabricated or bonded. The impurity layer IFO may be disposed between the second lower dummy pads 204*d*. For example, the impurity layer IFO may extend along the interface between the upper dielectric layer 240 and the lower dielectric layer 207 to connect neighboring second lower dummy pads 204*d* to each other.

According to some embodiments of the present inventive concepts, the power pads 220*da* may be coupled to the first dummy pattern 230*da* connected to the power circuit of the second dies 200-1 and 200-2, and no pads may be coupled to the second dummy pattern 230*db* connected to the ground circuit of the second dies 200-1 and 200-2. The second lower dummy pads 204*d* of the upper second die 200-2 may be electrically connected to the first dummy pattern 230*da* of the lower second die 200-1 and electrically insulated from the second dummy pattern 230*db* of the lower second die 200-1. Therefore, even when the second lower dummy pads 204*d* are electrically connected to each other through the impurity layer IFO, the risk of an electrical short occurring between the ground circuit and the power circuit in the second dies 200-1 and 200-2 may be reduced. Accordingly, the semiconductor package may have improved electrical properties and operating stability.

According to some embodiments, the upper dielectric layer 240 and the lower dielectric layer 207 may constitute a hybrid bonding of oxide, nitride, or oxynitride. For example, the upper dielectric layer 240 and its bonded lower dielectric layer 207 may have a continuous configuration, and an invisible interface may be present between the upper dielectric layer 240 and the lower dielectric layer 207. The upper dielectric layer 240 and the lower dielectric layer 207 may be formed of the same material and may have no interface therebetween. For example, the upper dielectric layer 240 and the lower dielectric layer 207 may be provided in the form of a single unitary or monolithic piece. In this case, the impurity layer IFO may be positioned in one dielectric layer formed of the upper dielectric layer 240 and the lower dielectric layer 207, and may connect to each other and the second lower dummy pads 204*d* that are adjacent to each other in the dielectric layer.

Referring again to FIGS. 1 to 2A to 2D, the die stack DS and the first die 100 may constitute a chip-on-wafer (COW) structure. For example, a lowermost second die 200 may be positioned face down to allow its bottom surface to face toward the top surface of the first die 100. The lowermost second die 200 may be mounted through the second lower pads 204 on the first die 100. For example, the second lower pads 204 of the lowermost second die 200 may be vertically aligned with the first upper pads 120. The first die 100 and the lowermost second die 200 may be bonded to each other. On an interface between the first die 100 and the lowermost second die 200, the first upper pads 120 may be bonded to the second lower pads 204. In this case, the first upper pads 120 and the second lower pads 204 may constitute an intermetallic hybrid bonding. In other embodiments, the lowermost second die 200 may be mounted on the first die 100 through bumps provided on the second lower pads 204. In this case, the first upper pads 120 of the first die 100 may be connected through the bumps to the second lower pads 204 of the second die 200.

A molding layer 300 may be provided on the top surface of the first die 100. The molding layer 300 may be on and at least partially cover the top surface of the first die 100. When viewed in plan, the molding layer 300 may border and at least partially surround the die stack DS. A top surface of the molding layer 300 may expose a top surface of the die stack DS or the top surface of the uppermost second die 200. The molding layer 300 may include a dielectric polymer material. For example, the molding layer 300 may include an epoxy molding compound (EMC).

In the embodiment that follows, a detailed description of technical features repetitive to those discussed above with reference to FIGS. 1 and 2A to 2D will be omitted, and a difference thereof will be discussed in detail. The same reference numerals may be allocated to the same components as those of the semiconductor package discussed above according to some embodiments of the present inventive concepts.

Figure 3A:
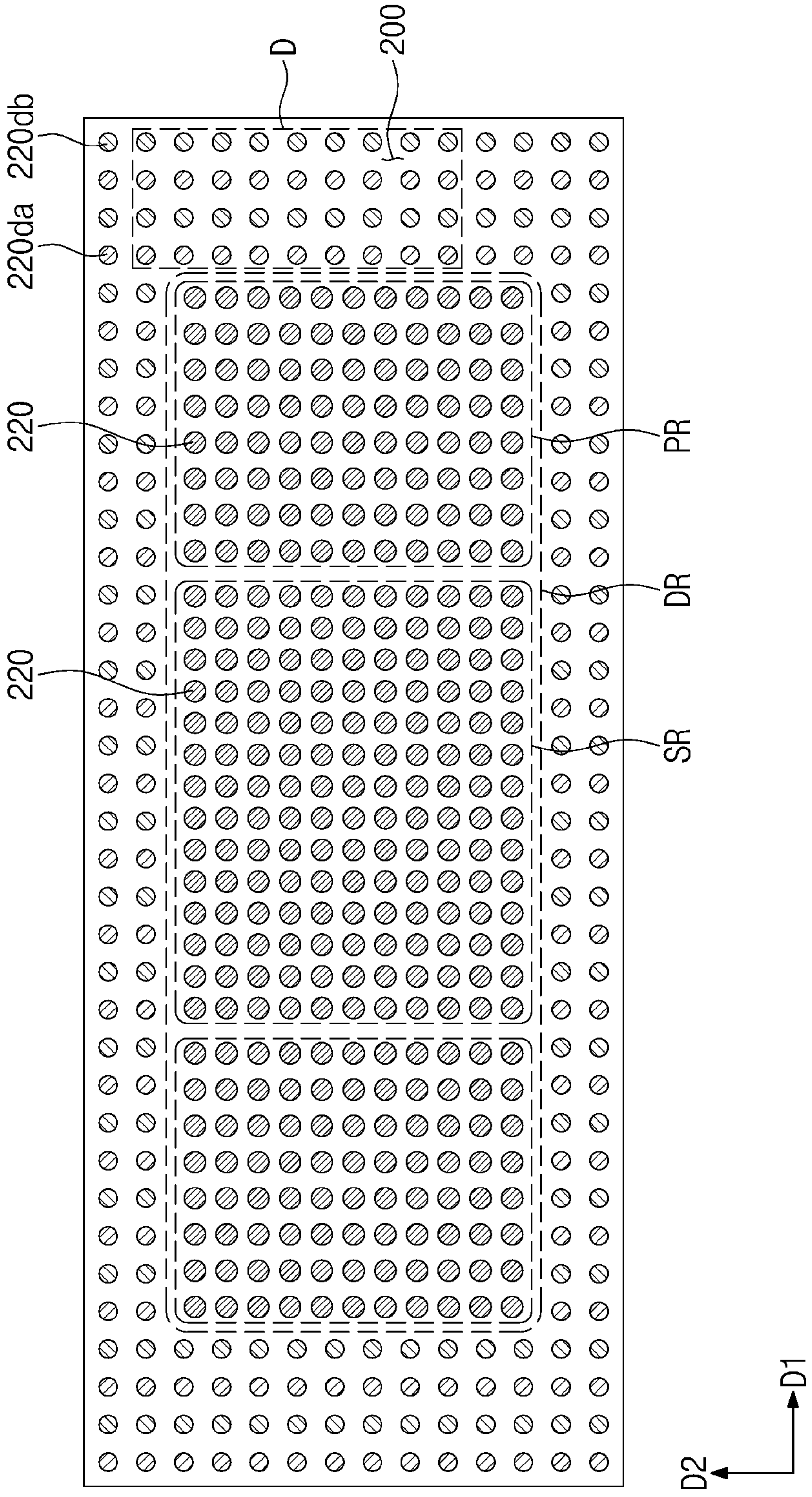
FIG. 3A is a plan view illustrating a semiconductor package according to some embodiments of the present inventive concepts.
Figure 3B:
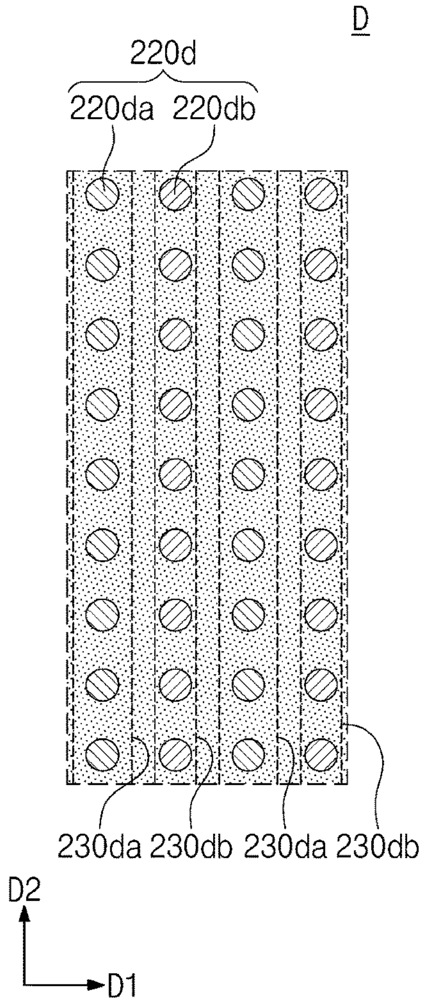
FIG. 3B is an enlarged view illustrating section D of FIG. 3A.
Figure 3C:
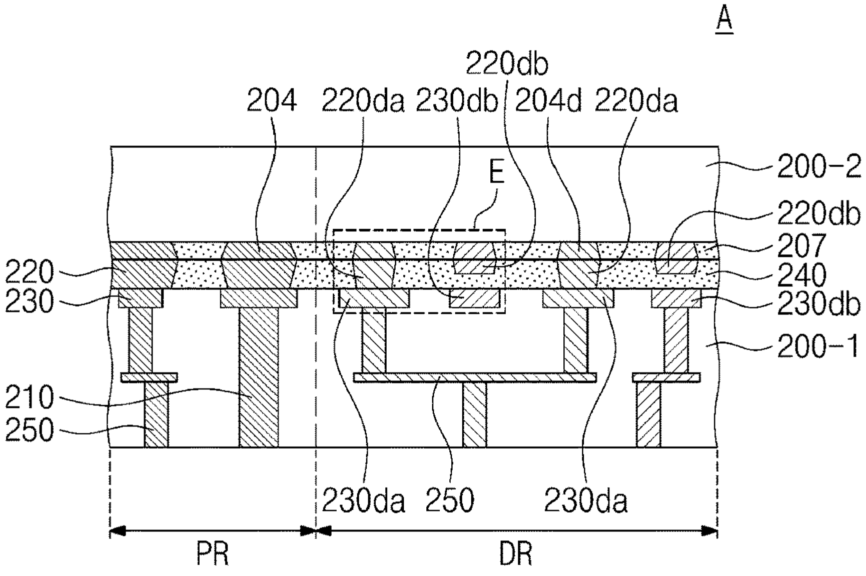
FIG. 3C is an enlarged view illustrating section A of FIG. 1.
Figure 3D:
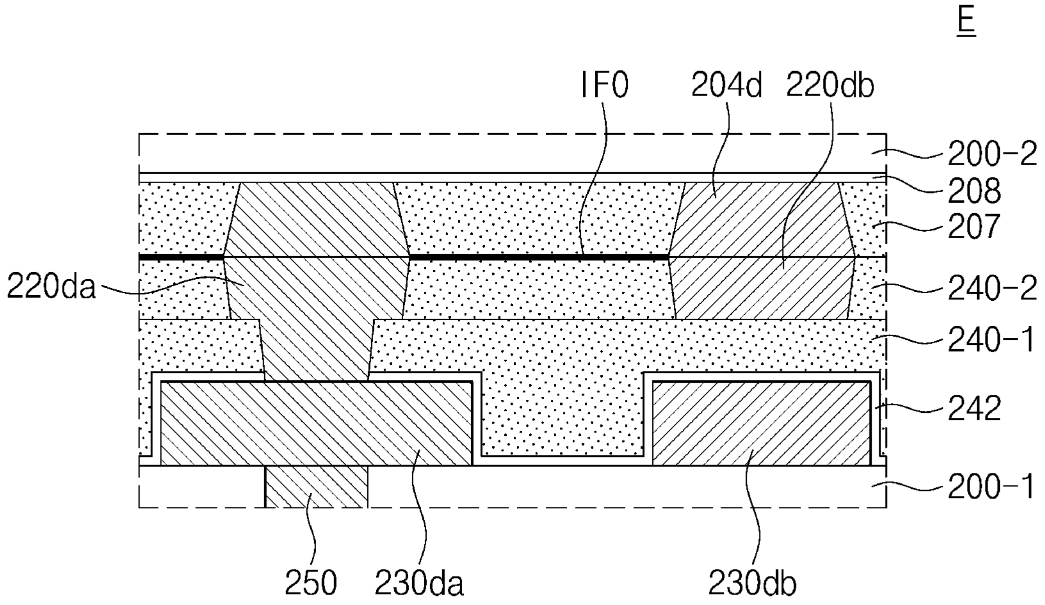
FIG. 3D is an enlarged view illustrating section E of FIG. 3C.

FIG. 3A is a plan view illustrating a semiconductor package according to some embodiments of the present inventive concepts. FIG. 3B is an enlarged view illustrating section D of FIG. 3A. FIG. 3C is an enlarged view illustrating section A of FIG. 1. FIG. 3D is an enlarged view illustrating section E of FIG. 3C.

Referring to FIGS. 1 and 3A to 3D, the second dies 200 of the semiconductor package may further include ground pads 220*db*. For example, the second upper dummy pads 220*d* may include the power pads 220*da* provided on the first dummy patterns 230*da* and the ground pads 220*db* provided on the second dummy patterns 230*db*.

The power pads 220*da* may vertically extend into or penetrate the upper dielectric layer 240 to be coupled to the top surfaces of the first dummy patterns 230*da*. The power pads 220*da* may be exposed on the top surface of the upper dielectric layer 240. In this configuration, top surfaces of the power pads 220*da* may be substantially coplanar with the top surface of the upper dielectric layer 240.

The power pads 220*da* may have a damascene structure. For example, the power pads 220*da* may each have a head part and a tail part that are connected into a single unitary or monolithic piece. The head part and the tail part of the power pad 220*da* may have a T shape when viewed in vertical section.

The upper dielectric layer 240 may include a first upper dielectric layer 240-1 and a second upper dielectric layer 240-2 that are stacked on the upper barrier pattern 242. The first upper dielectric layer 240-1 may be on and at least partially cover the wiring patterns 230 and may border and at least partially surround the tail parts of the power pads 220*da* in a plan view. On the first upper dielectric layer 240-1, the second upper dielectric layer 240-2 may surround the head parts of the power pads 220*da*.

The ground pads 220*db* may be disposed above and electrically insulated from the second dummy patterns 230*db*. For example, the ground pads 220*db* may be vertically (D3 direction) spaced apart from the second dummy patterns 230*db*. The ground pads 220*db* may be disposed on the first upper dielectric layer 240-1 and may vertically extend into or penetrate the second upper dielectric layer 240-2. The ground pads 220*db* may have a shape the same as or similar to that of the head parts of the power pads 220*da*. The upper dielectric layer 240, or the first upper dielectric layer 240-1, may be interposed between the ground pads 220*db* and the second dummy patterns 230*db*. The ground pads 220*db* may be exposed on the top surface of the upper dielectric layer 240. In this case, top surfaces of the ground pads 220*db* may be substantially coplanar with the top surface of the upper dielectric layer 240.

Neighboring second dies 200 may be connected to each other. For example, the second dies 200 may be vertically (D3 direction) stacked on the first die 100. The second upper pads 220 of a certain second die 200 may be vertically aligned with the second lower pads 204 of another second die 200 adjacent to the certain second die 200. The adjacent second dies 200 may be bonded to each other.

Referring to FIGS. 3C and 3D, the lower second die 200-1 may be connected to the upper second die 200-2. For example, the lower second die 200-1 may be bonded to the upper second die 200-2. On an interface between the lower second die 200-1 and the upper second die 200-2, the second upper pads 220 of the lower second die 200-1 may be bonded to the second lower pads 204 of the upper second die 200-2. In this case, the second upper pads 220 and the second lower pads 204 may constitute an intermetallic hybrid bonding.

On the signal region SR, the signal pads of the second upper pads 220 may be bonded to the signal pads of the second lower pads 204. On the peripheral regions PR, the power/ground pads of the second upper pads 220 may be bonded to the power/ground pads of the second lower pads 204. On the dummy region DR, the power pads 220*da* of the second upper pads 220 may be bonded to ones of the second lower dummy pads 204*d* of the second lower pads 204. On the dummy region DR, the ground pads 220*db* of the second upper pads 220 may be bonded to other ones of the second lower dummy pads 204*d* of the second lower pads 204.

According to some embodiments of the present inventive concepts, the second upper dummy pads 220*d* may include the ground pads 220*db* in addition to the power pads 220*da*. Therefore, on the dummy region DR that corresponds to an outer portion of the second die 200, a large number of the second upper dummy pads 220*d* may be bonded to the second lower dummy pads 204*d*. Accordingly, the lower second die 200-1 and the upper second die 200-2 may be strongly bonded to each other, and the semiconductor package may increase in structural stability.

In addition, because the ground pads 220*db* are electrically insulated from the second dummy patterns 230*db*, even when the power pads 220*da* and the ground pads 220*db* are electrically connected through the impurity layer IFO, the risk of an electrical short occurring between the ground circuit and the power circuit in the second dies 200-1 and 200-2 may be reduced. As a result, the semiconductor package may have improved electrical properties and operating stability.

Figure 4A:
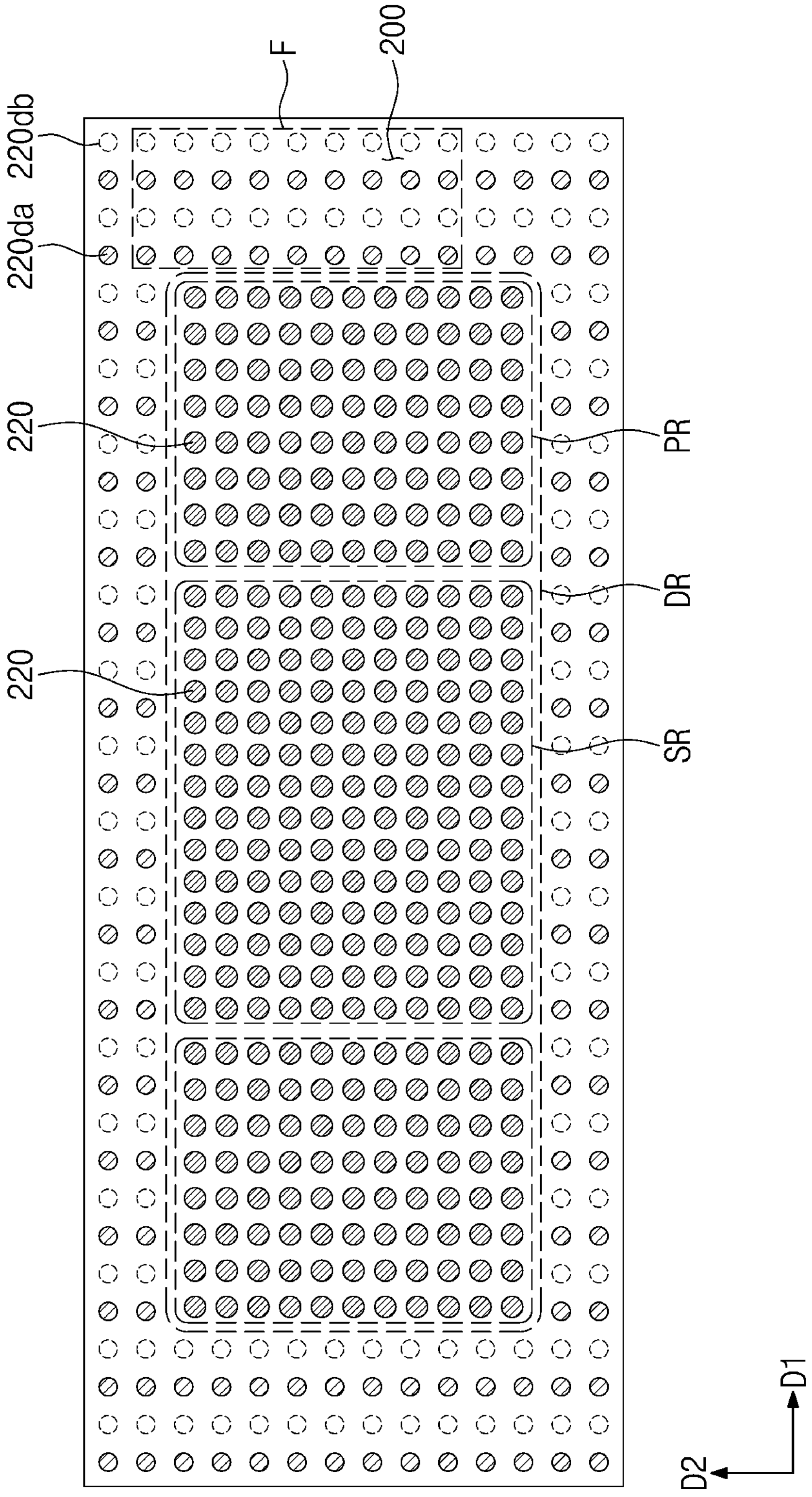
FIG. 4A is a plan view illustrating a semiconductor package according to some embodiments of the present inventive concepts.
Figure 4B:
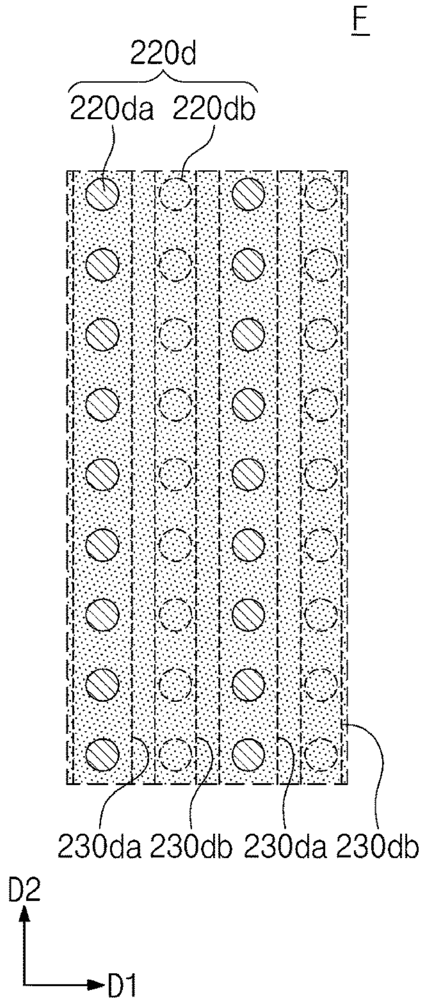
FIG. 4B is an enlarged view illustrating section F of FIG. 4A.
Figure 4C:
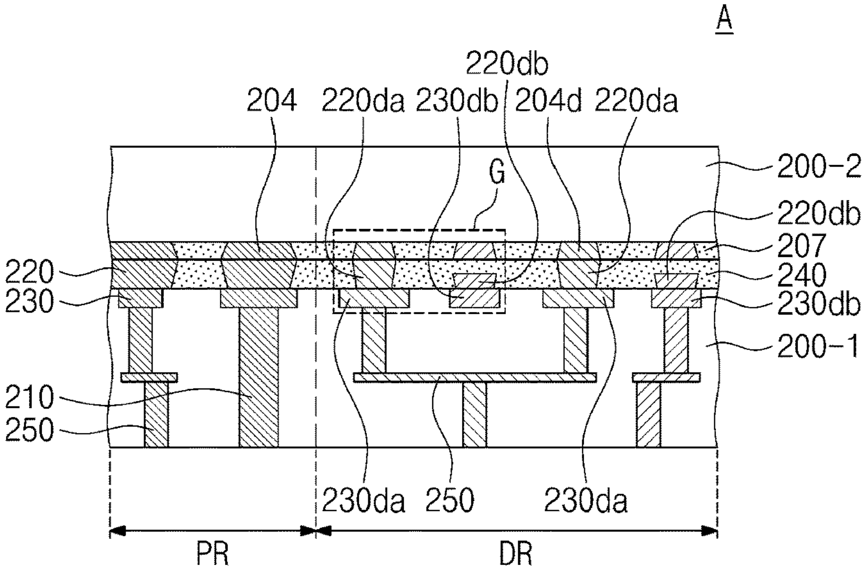
FIG. 4C is an enlarged view illustrating section A of FIG. 1.
Figure 4D:
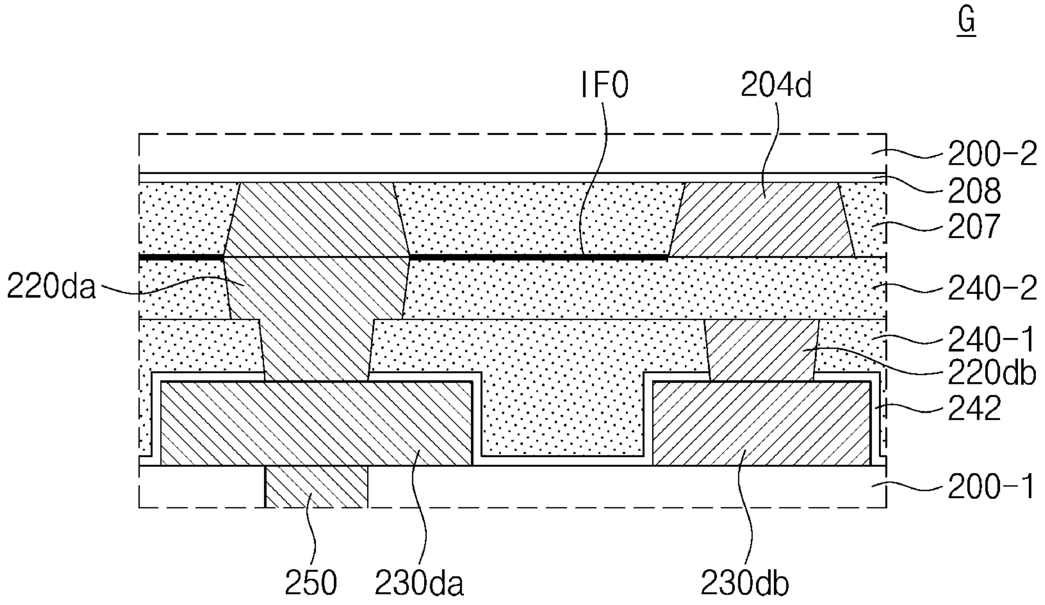
FIG. 4D is an enlarged view illustrating section G of FIG. 4C.

FIG. 4A is a plan view illustrating a semiconductor package according to some embodiments of the present inventive concepts. FIG. 4B illustrates an enlarged view showing section F of FIG. 4A. FIG. 4C is an enlarged view illustrating section A of FIG. 1. FIG. 4D is an enlarged view illustrating section G of FIG. 4C.

Referring to FIGS. 1 and 4A to 4D, the second dies 200 of the semiconductor package may further include ground pads 220*db*. For example, the second upper dummy pads 220*d* may be coupled to the dummy patterns 230*da* and 230*db*. The second upper dummy pads 220*d* may include the power pads 220*da* provided on the first dummy patterns 230*da* and the ground pads 220*db* provided on the second dummy patterns 230*db*.

The power pads 220*da* may vertically (D3 direction) penetrate the upper dielectric layer 240 to couple to the top surfaces of the first dummy patterns 230*da*. The power pads 220*da* may be exposed on the top surface of the upper dielectric layer 240. In this configuration, top surfaces of the power pads 220*da* may be substantially coplanar with the top surface of the upper dielectric layer 240.

The power pads 220*da* may have a damascene structure. For example, the power pads 220*da* may each have a head part and a tail part that are connected into a single unitary or monolithic piece. The head part and the tail part of the power pad 220*da* may have a T shape when viewed in vertical section.

The upper dielectric layer 240 may include a first upper dielectric layer 240-1 and a second upper dielectric layer

240-2 that are stacked on the upper barrier pattern 242. The first upper dielectric layer 240-1 may be on and at least partially cover the wiring patterns 230 and may border or surround the tail parts of the power pads 220*da* in a plan view. On the first upper dielectric layer 240-1, the second upper dielectric layer 240-2 may border or surround the head parts of the power pads 220*da* in a plan view.

The ground pads 220*db* may extend into or penetrate the upper dielectric layer 240 to couple to the top surfaces of the second dummy patterns 230*db*. The ground pads 220*db* may not be exposed on the top surface of the upper dielectric layer 240. For example, the ground pads 220*db* may be disposed below and vertically (D3 direction) extend into or penetrate the second upper dielectric layer 240-2. The ground pads 220*db* may be on and at least partially covered with the upper dielectric layer 240 or the second upper dielectric layer 240-2. The ground pads 220*db* may have a shape the same as or similar to that of the tail parts of the power pads 220*da*.

Neighboring second dies 200 may be connected to each other. For example, the second dies 200 may be vertically (D3 direction) stacked on the first die 100. The second upper pads 220 of a certain second die 200 may be vertically aligned with the second lower pads 204 of another second die 200 adjacent to the certain second die 200. The adjacent second dies 200 may be bonded to each other.

Referring to FIGS. 4C and 4D, the lower second die 200-1 may be connected to the upper second die 200-2. For example, the lower second die 200-1 may be bonded to the upper second die 200-2. On an interface between the lower second die 200-1 and the upper second die 200-2, the second upper pads 220 of the lower second die 200-1 may be bonded to the second lower pads 204 of the upper second die 200-2. In this case, the second upper pads 220 and the second lower pads 204 may constitute an intermetallic hybrid bonding.

On the signal region SR, the signal pads of the second upper pads 220 may be bonded to the signal pads of the second lower pads 204. On the peripheral regions PR, the power/ground pads of the second upper pads 220 may be bonded to the power/ground pads of the second lower pads 204. On the dummy region DR, the power pads 220*da* of the second upper pads 220 may be bonded to the second lower dummy pads 204*d* of the second lower pads 204. On the dummy region DR, the ground pads 220*db* of the second upper pads 220 may be vertically (D3 direction) spaced apart from the second lower dummy pads 204*d* of the second lower pads 204. For example, the ground pads 220*db* may be spaced apart from an interface between the second dies 200-1 and 200-2. The upper dielectric layer 240, or the second upper dielectric layer 240-2, may be interposed between the ground pads 220*db* and the second lower dummy pads 204*d*.

According to some embodiments of the present inventive concepts, the ground pads 220*db* of the second upper dummy pads 220*d* may be spaced apart from the interface between the second dies 200-1 and 200-2. Therefore, even when the second lower dummy pads 204*d* are electrically connected to each other through the impurity layer IFO, the risk of an electrical short occurring between the ground circuit and the power circuit in the second dies 200-1 and 200-2 may be reduced. As a result, the semiconductor package may have improved electrical properties and operating stability.

Figure 5A:
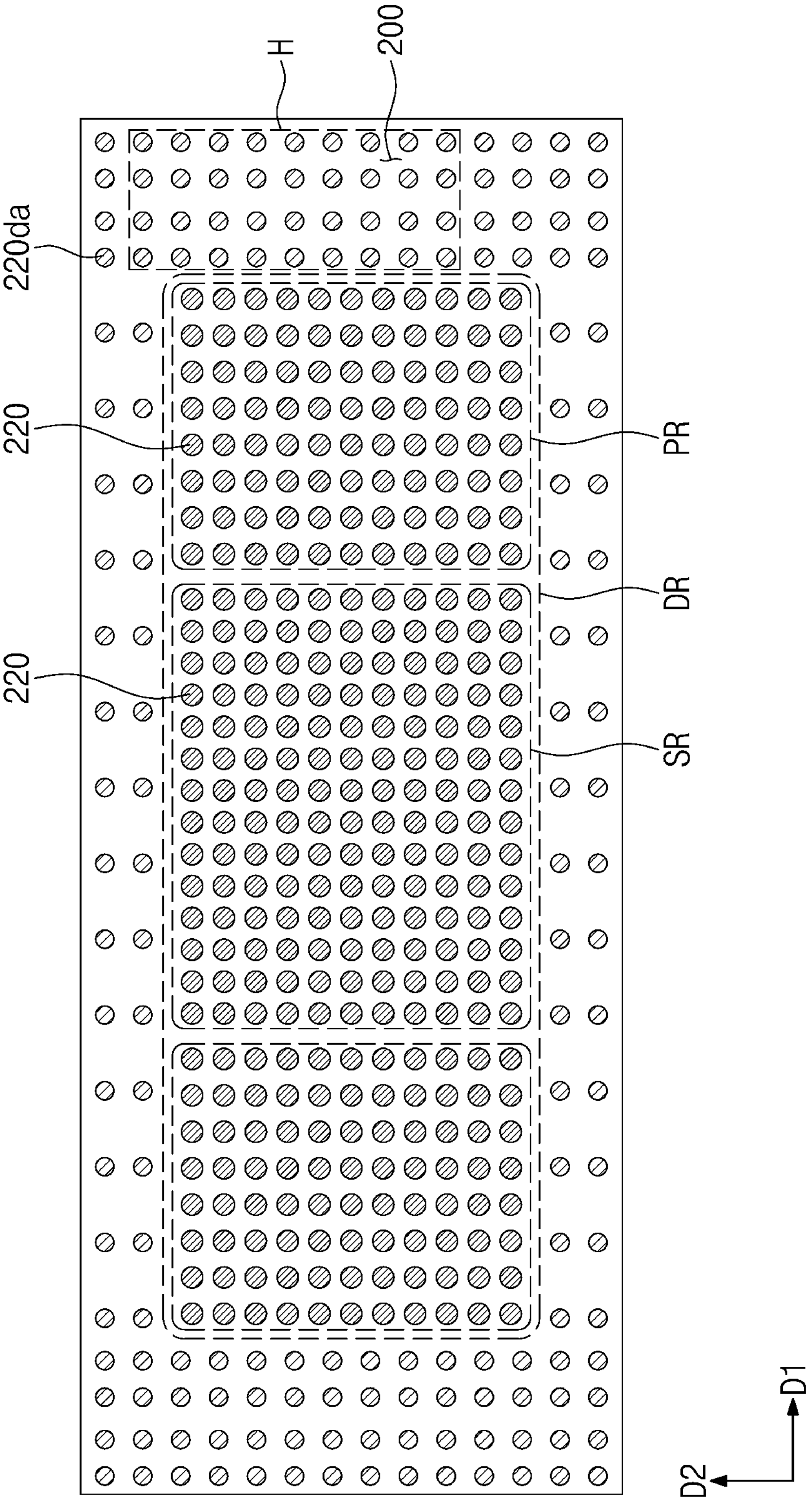
FIG. 5A is a plan view illustrating a semiconductor package according to some embodiments of the present inventive concepts.
Figure 5B:
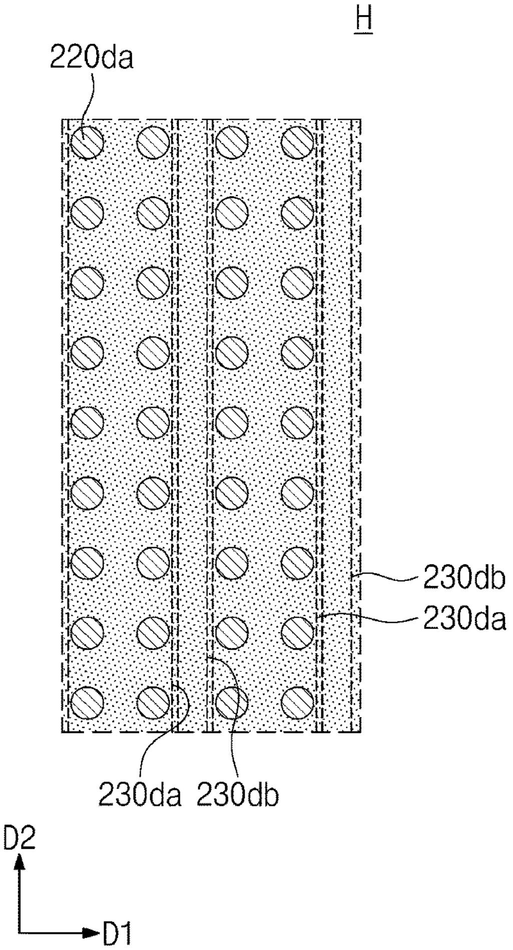
FIG. 5B is an enlarged view illustrating section H of FIG. 5A.
Figure 5C:
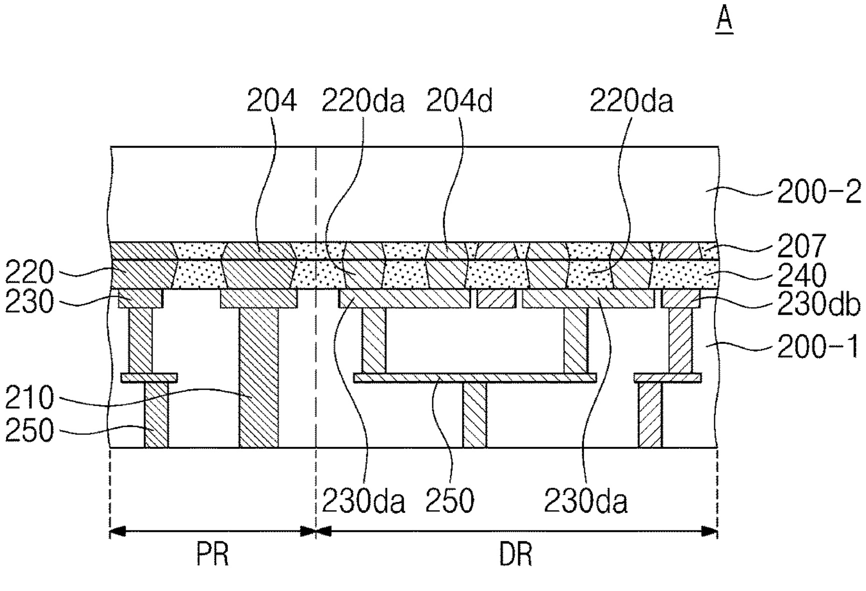
FIG. 5C is an enlarged view illustrating section A of FIG. 1.

FIG. 5A is a plan view illustrating a semiconductor package according to some embodiments of the present inventive concepts. FIG. 5B is an enlarged view illustrating section H of FIG. 5A. FIG. 5C illustrates an enlarged view showing section A of FIG. 1.

Referring to FIGS. 1 and 5A to 5C, the second upper dummy pads 220*d* may be coupled to the dummy patterns 230*da* and 230*db*. For example, the second upper dummy pads 220*d* may include power pads 220*da* provided on the first dummy patterns 230*da*. The second upper dummy pads 220*d* may not be provided on the second dummy patterns 230*db*. On one first dummy pattern 230*da*, the power pads 220*da* may be arranged in the second direction D2. In this configuration, two rows of the power pads 220*da* may be disposed on one first dummy pattern 230*da*. For example, a two-to-one correspondence may be established between the rows of the power pads 220*da* and the first dummy patterns 230*da*. The present inventive concepts, however, are not limited thereto. In some embodiments, three or more rows of the power pads 220*da* may be provided on one first dummy pattern 230*da*.

According to some embodiments of the present inventive concepts, many of the power pads 220*da* may be provided on one first dummy pattern 230*da*. Therefore, on the dummy region DR that corresponds to an outer portion of the second die 200, a large number of the second upper dummy pads 220*d* may be bonded to the second lower dummy pads 204*d*. Accordingly, the lower second die 200-1 and the upper second die 200-2 may be strongly bonded to each other, and the semiconductor package may have improved structural stability.

Figure 6A:
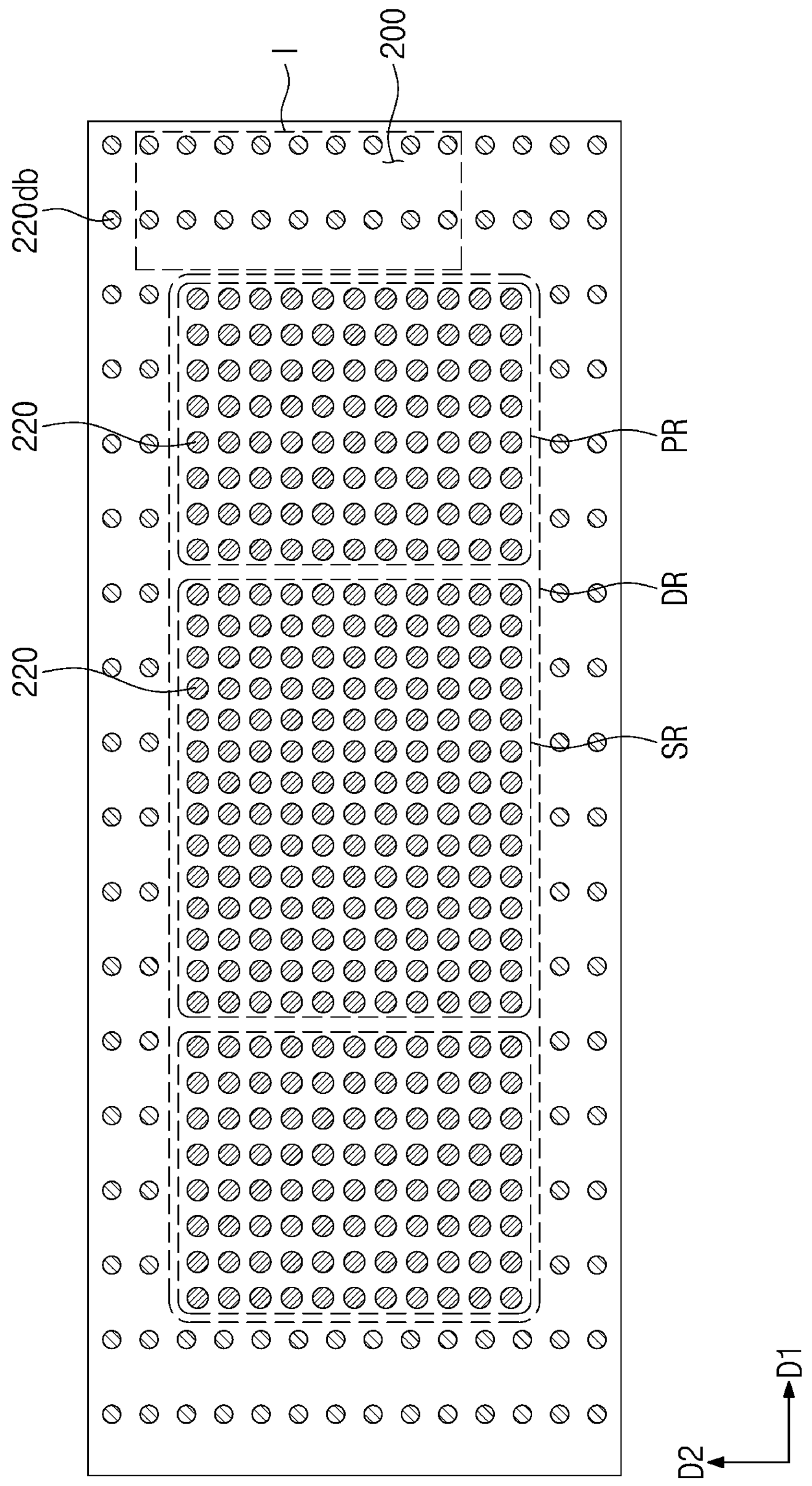
FIG. 6A is a plan view illustrating a semiconductor package according to some embodiments of the present inventive concepts.
Figure 6B:
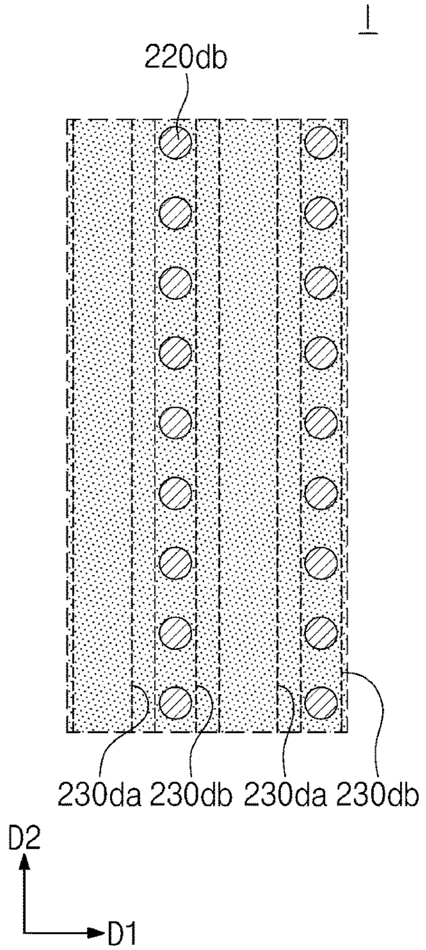
FIG. 6B is an enlarged view illustrating section I of FIG. 6A.
Figure 6C:
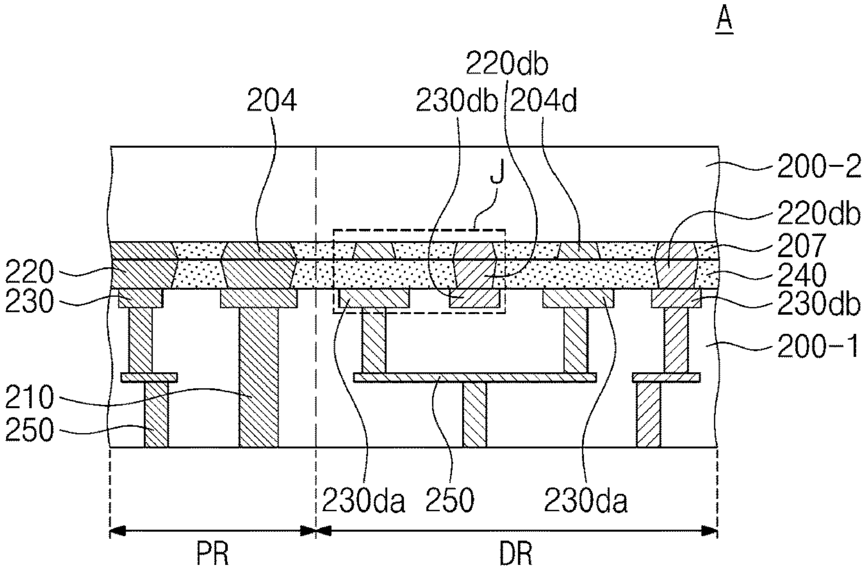
FIG. 6C is an enlarged view illustrating section A of FIG. 1.
Figure 6D:
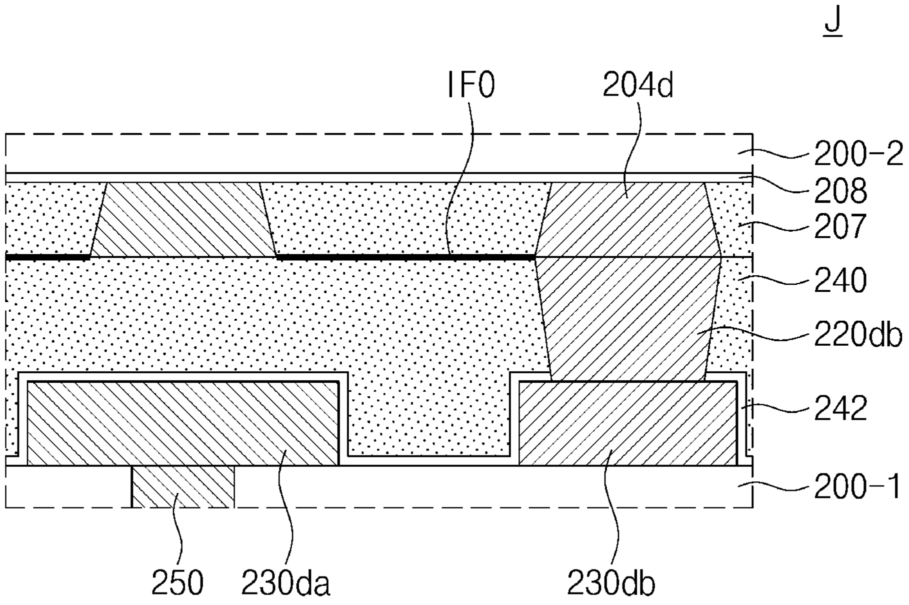
FIG. 6D is an enlarged view illustrating section J of FIG. 6C.

FIG. 6A is a plan view illustrating a semiconductor package according to some embodiments of the present inventive concepts. FIG. 6B is an enlarged view illustrating section I of FIG. 6A. FIG. 6C is an enlarged view illustrating section A of FIG. 1. FIG. 6D is an enlarged view illustrating section J of FIG. 6C.

Referring to FIGS. 1 and 6A to 6D, the second upper pads 220 may be provided on the top surface of the second die 200. For example, the second upper pads 220 may be provided on the wiring patterns 230. The second upper pads 220 may vertically extend into or penetrate the upper dielectric layer 240 and the upper barrier pattern 242 to couple to the top surfaces of the wiring patterns 230. A top surface of the upper dielectric layer 240 may be substantially coplanar with those of the second upper pads 220.

The second upper dummy pads 220*d* may be coupled to the dummy patterns 230*da* and 230*db*. For example, the second upper dummy pads 220*d* may include ground pads 220*db* provided on the second dummy patterns 230*db*. The second upper dummy pads 220*d* may not be provided on the first dummy patterns 230*da*. No pads for electrical connection may be separately provided on the first dummy patterns 230*da*. The ground pads 220*db* may be coupled to the top surfaces of the second dummy patterns 230*db*. On one second dummy pattern 230*db*, the ground pads 220*db* may be arranged in the second direction D2. For example, the ground pads 220*db* may be arranged to constitute a plurality of rows that are disposed along the first direction D1, and each row of the ground pads 220*db* may be located on one second dummy pattern 230*db*. In this configuration, a one-to-one correspondence may be established between the rows of the ground pads 220*db* and the second dummy patterns 230*db*. An interval in the first direction D1 between the ground pads 220*db*, or an interval between the rows of the ground pads 220*db*, may be in a range of about 3 micrometers to about 30 micrometers.

According to some embodiments of the present inventive concepts, the second upper dummy pads 220*d* and the dummy patterns 230*da* and 230*db* may be provided on the dummy region DR. Therefore, even on the dummy region DR that corresponds to an outer portion of the second die 200, heat may be thermally radiated through the second upper dummy pads 220*d* and the dummy patterns 230*da* and 230 *db*. In addition, the ground pads 220*db* and the second dummy patterns 230*db* may be electrically connected to the ground circuit of the second die 200, and the ground pads 220*db* may be used as test pads.

The lower second die 200-1 may be connected to the upper second die 200-2. On the signal region SR, the signal pads of the second upper pads 220 may be bonded to the signal pads of the second lower pads 204. On the peripheral regions PR, the power/ground pads of the second upper pads 220 may be bonded to the power/ground pads of the second lower pads 204. On the dummy region DR, the second upper dummy pads 220*d* of the second upper pads 220, or the ground pads 220*db* may be bonded to the second lower dummy pads 204*d* of the second lower pads 204. The second upper dummy pads 220*d* may not be provided below ones of the second lower dummy pads 204*d* positioned on the first dummy patterns 230*da*, and the ones of the second lower dummy pads 204*d* may be bonded to a top surface of the upper dielectric layer 240 of the lower second die 200-1.

Figure 7:
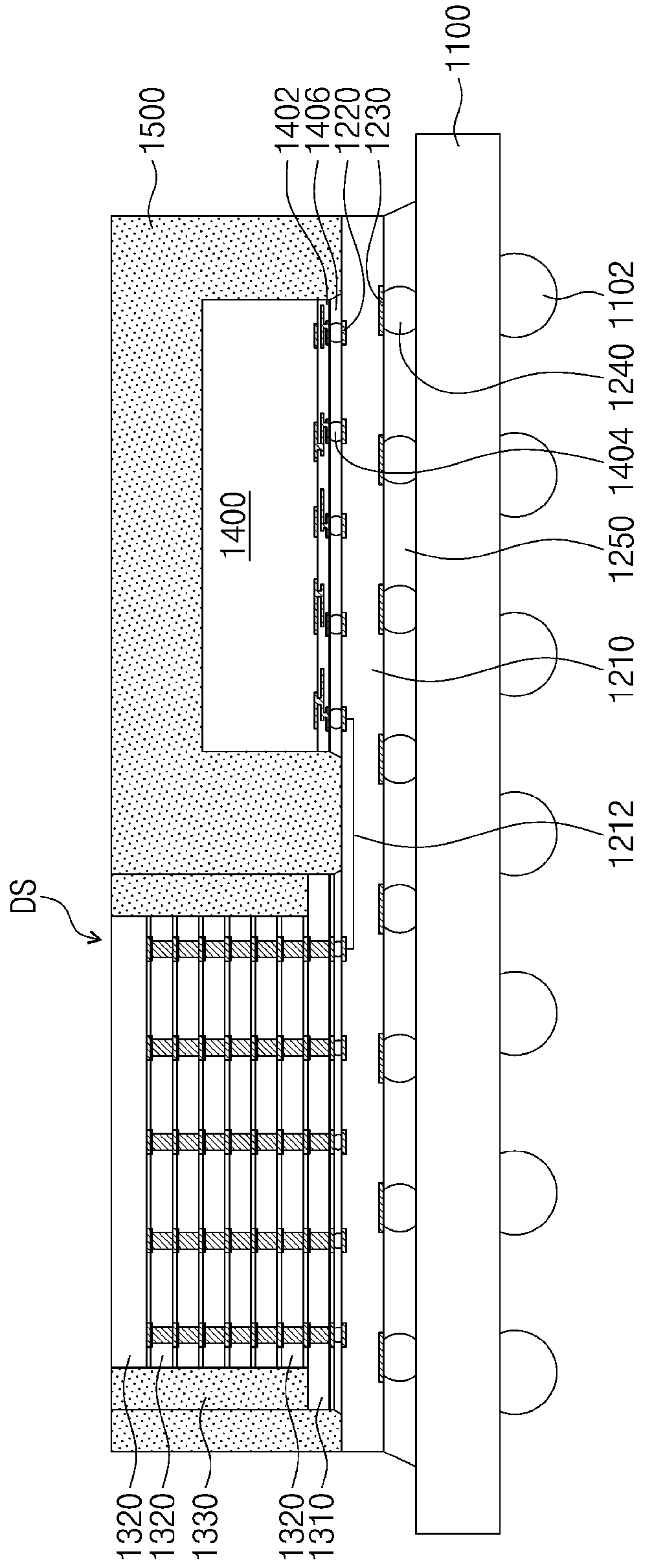
FIG. 7 is a cross-sectional view illustrating a semiconductor package according to some embodiments of the present inventive concepts.

FIG. 7 is a cross-sectional view illustrating a semiconductor package according to some embodiments of the present inventive concepts.

Referring to FIG. 7, a package substrate 1100 may be provided. The package substrate 1100 may include a printed circuit board (PCB) having a signal pattern on a top surface thereof. In other embodiments, the package substrate 1100 may have a structure in which at least one dielectric layer and at least one wiring layer are alternately stacked. The package substrate 1100 may have pads disposed on a top surface thereof.

A plurality of external terminals 1102 may be disposed below the package substrate 1100. For example, the external terminals 1102 may be disposed on terminal pads provided on a bottom surface of the package substrate 1100. The external terminals 1102 may include solder balls or solder bumps, and based on type and arrangement of the external terminals 1102, a semiconductor package may be provided in the form of one of a ball grid array (BGA) type, a fine ball-grid array (FBGA) type, and a land grid array (LGA) type.

An interposer substrate 1210 may be provided on the package substrate 1100. The interposer substrate 1210 may be mounted on the top surface of the package substrate 1100. The interposer substrate 1210 may include first substrate pads 1220 exposed on a top surface of the interposer substrate 1210 and second substrate pads 1230 exposed on a bottom surface of the interposer substrate 1210. The interposer substrate 1210 may redistribute a die stack DS and a second semiconductor chip 1400, which will be described below. For example, the first substrate pads 1220 and the second substrate pads 1230 may be electrically connected through a circuit wiring line in the interposer substrate 1210, and the first substrate pads 1220, the second substrate pads 1230, and the circuit wiring line may constitute a redistribution circuit.

The interposer substrate 1210 may be provided with substrate terminals 1240 on the bottom surface thereof. The substrate terminals 1240 may be provided between the pads of the package substrate 1100 and the second substrate pads 1230 of the interposer substrate 1210. The substrate terminals 1240 may electrically connect the interposer substrate 1210 to the package substrate 1100. For example, the interposer substrate 1210 may be flip-chip mounted on the package substrate 1100. The substrate terminals 1240 may include solder balls or solder bumps. A first underfill 1250 may be provided between the package substrate 1100 and the interposer substrate 1210. The first underfill 1250 may border or surround the substrate terminals 1240 in a plan view, while at least partially filling a space between the package substrate 1100 and the interposer substrate 1210.

A die stack DS may be disposed on the interposer substrate 1210. The die stack DS may correspond to the semiconductor package described with reference to FIGS. 1 to 6D. For example, the die stack DS may include a base semiconductor chip 1310, first semiconductor chips 1320 stacked on the base semiconductor chip 1310, and a first molding layer 1330 that borders or surrounds the first semiconductor chips 1320 in a plan view. The base semiconductor chip 1310 may correspond to the first die 100 of FIG. 1, the first semiconductor chips 1320 may each correspond to the second die 200 of FIG. 1, and the first molding layer 1330 may correspond to the molding layer 300 of FIG. 1.

The die stack DS may be mounted on the interposer substrate 1210. For example, the die stack DS may be coupled through stack connection terminals of the base semiconductor chip 1310 to the first substrate pads 1220 of the interposer substrate 1210.

A second underfill 1318 may be provided between the interposer substrate 1210 and the die stack DS. The second underfill 1318 may border or surround the stack connection terminals in a plan view, while at least partially filling a space between the interposer substrate 1210 and the base semiconductor chip 1310.

A second semiconductor chip 1400 may be disposed on the interposer substrate 1210. On the interposer substrate 1210, the second semiconductor chip 1400 may be disposed spaced apart from the die stack DS. The second semiconductor chip 1400 may have a thickness greater than respective ones of the first semiconductor chips 1320. The second semiconductor chip 1400 may include a circuit layer 1402. The circuit layer 1402 may include a logic circuit. For example, the second semiconductor chip 1400 may be a logic chip. A plurality of bumps 1404 may be provided on a bottom surface of the second semiconductor chip 1400. For example, the second semiconductor chip 1400 may be coupled through the bumps 1404 to the first substrate pads 1220 of the interposer substrate 1210. The second semiconductor chip 1400 and the die stack DS may be electrically connected through a circuit wiring line 1212 in the interposer substrate 1210. A third underfill 1406 may be provided between the interposer substrate 1210 and the second semiconductor chip 1400. The third underfill 1406 may border or surround the bumps 1404 in a plan view, while at least partially filling a space between the interposer substrate 1210 and the second semiconductor chip 1400.

A second molding layer 1500 may be provided on the interposer substrate 1210. The second molding layer 1500 may be on and at least partially cover the top surface of the interposer substrate 1210. The second molding layer 1500 may border or surround the die stack DS and the second semiconductor chip 1400 in a plan view. The second molding layer 1500 may have a top surface located at the same level (D3 direction) as that of a top surface of the die stack DS.

Figure 8:
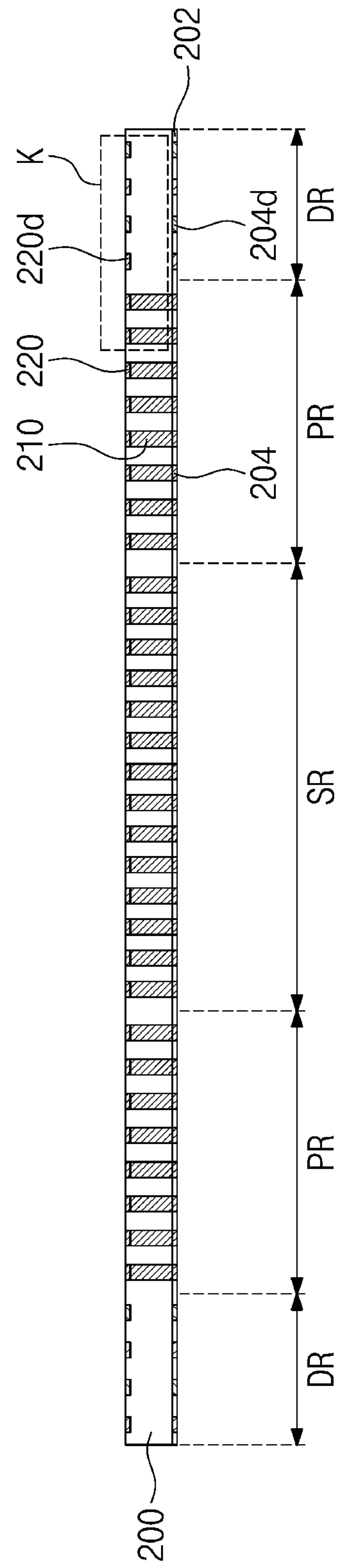
FIG. 8 is a cross-sectional view illustrating a method of fabricating a semiconductor package according to some embodiments of the present inventive concepts.

FIG. 8 is a cross-sectional view illustrating a method of fabricating a semiconductor package according to some embodiments of the present inventive concepts. FIGS. 9A to 11A are cross-sectional views of section K depicted in FIG.

Figure 12:
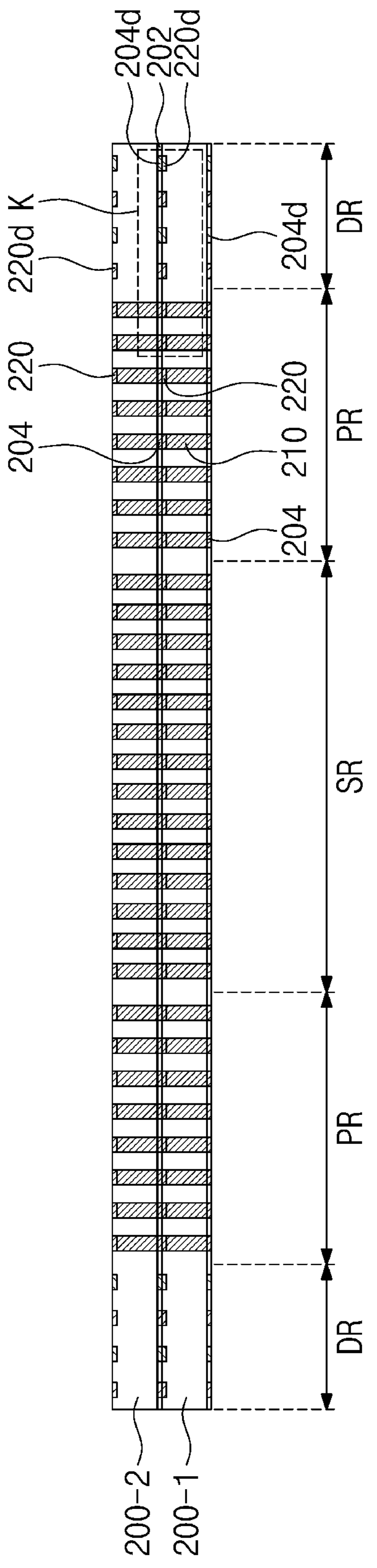
FIG. 12 is a cross-sectional view illustrating a method of fabricating a semiconductor package according to some embodiments of the present inventive concepts.
Figure 13A:
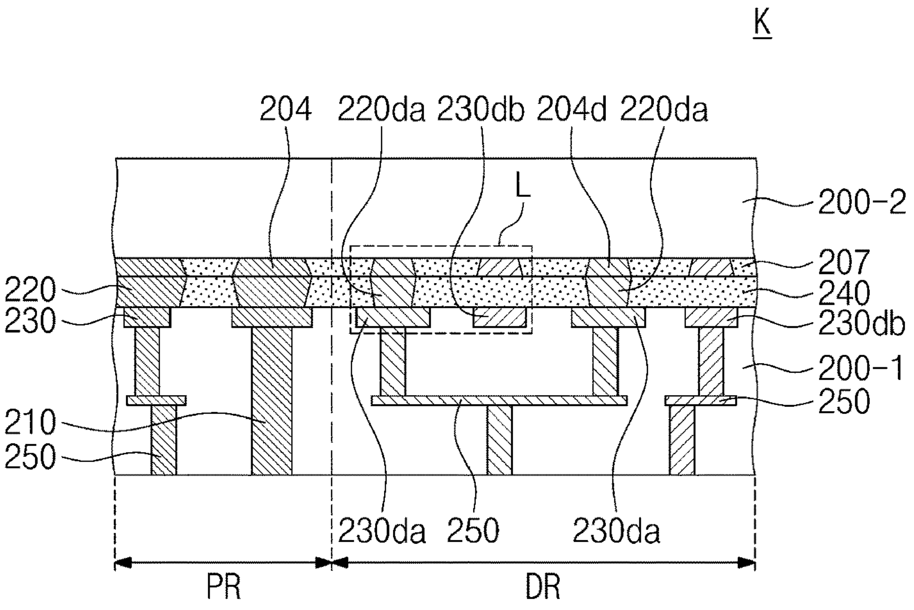
FIGS. 13A and 14A are cross-sectional views of section K depicted in FIG. 12, illustrating a method of fabricating a semiconductor package according to some embodiments of the present inventive concepts.
Figure 13B:
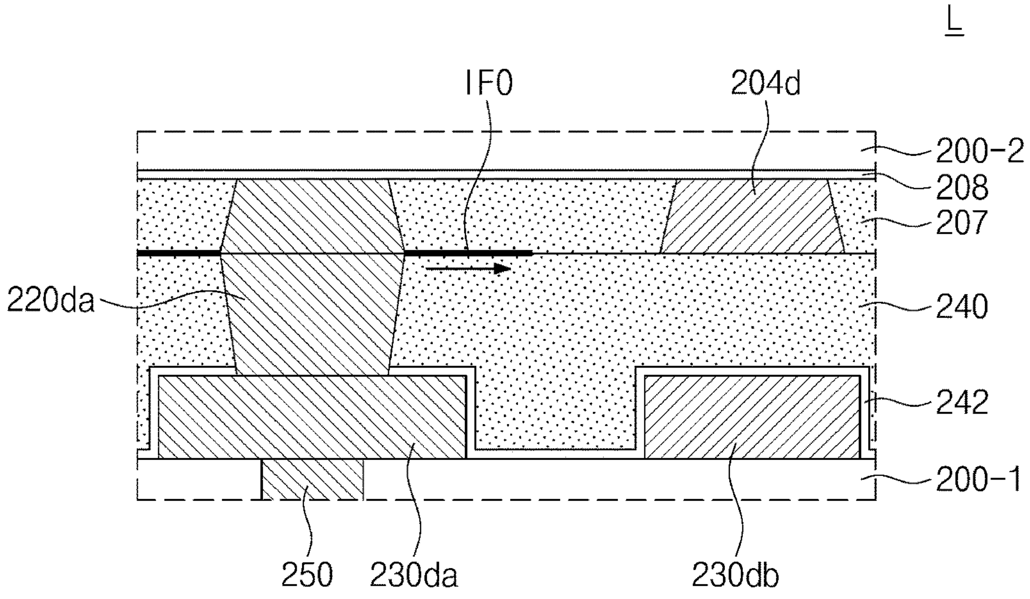
FIGS. 13B and 14B are enlarged views illustrating section L of FIGS. 13A and 14A, respectively.
Figure 14A:
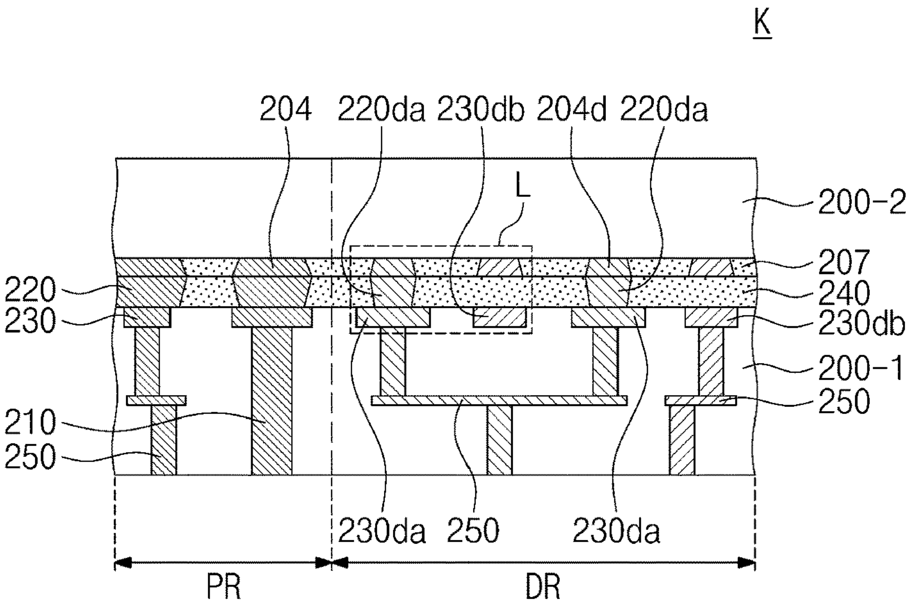
Figure 14B:
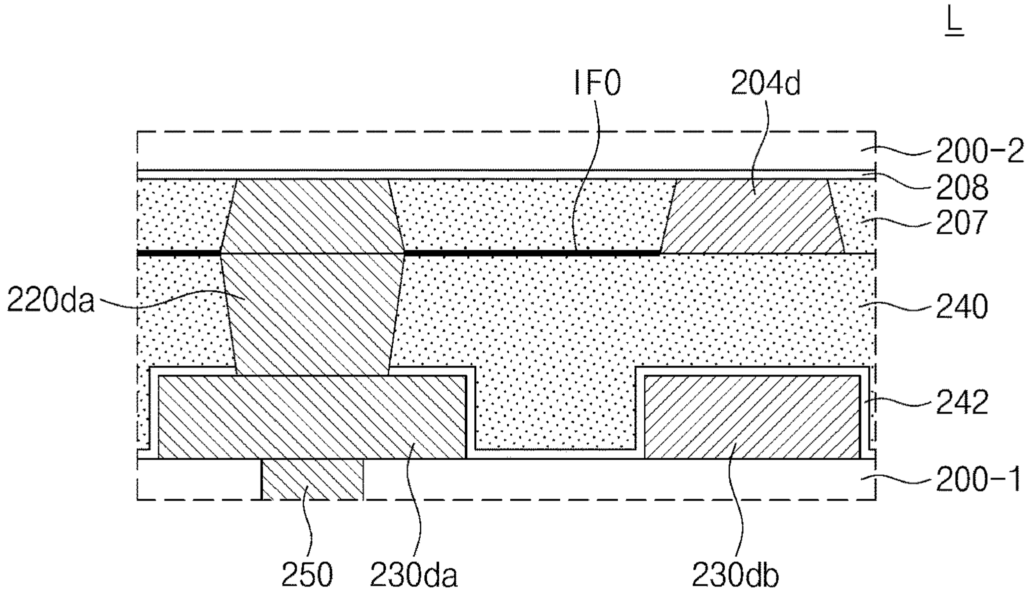

8, illustrating a method of fabricating a semiconductor package according to some embodiments of the present inventive concepts. FIGS. 9B to 11B are enlarged views illustrating section L of FIGS. 9A to 11A, respectively. FIG. 12 is a cross-sectional view illustrating a method of fabricating a semiconductor package according to some embodiments of the present inventive concepts. FIGS. 13A and 14A are cross-sectional views of section K depicted in FIG. 12, illustrating a method of fabricating a semiconductor package according to some embodiments of the present inventive concepts. FIGS. 13B and 14B are enlarged views illustrating section L of FIGS. 13A and 14A, respectively.

An ordinary process may be used to form a second die 200. FIGS. 9A to 11A and 9B to 11B show a detailed illustration of a method of fabricating the second die 200, and the method of fabricating the second die 200 will be described below with reference to FIGS. 9A to 11A and 9B to 11B.

Figure 9A:
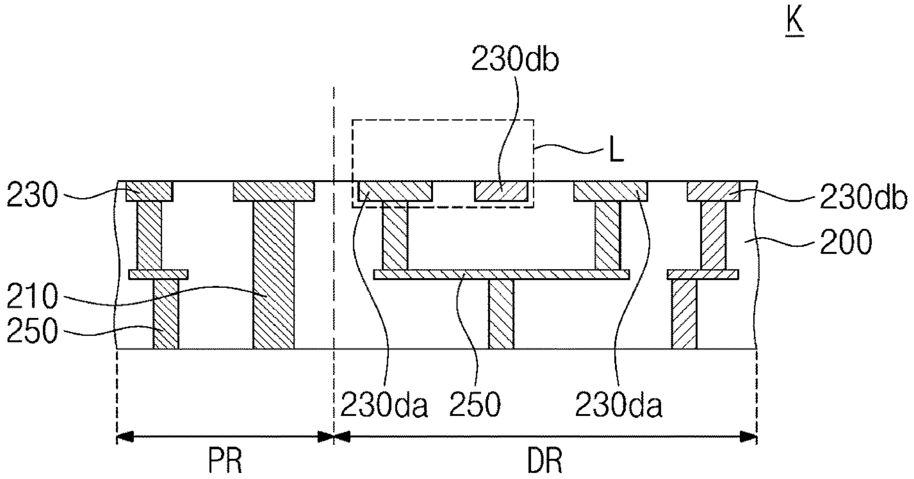
Figure 9B:
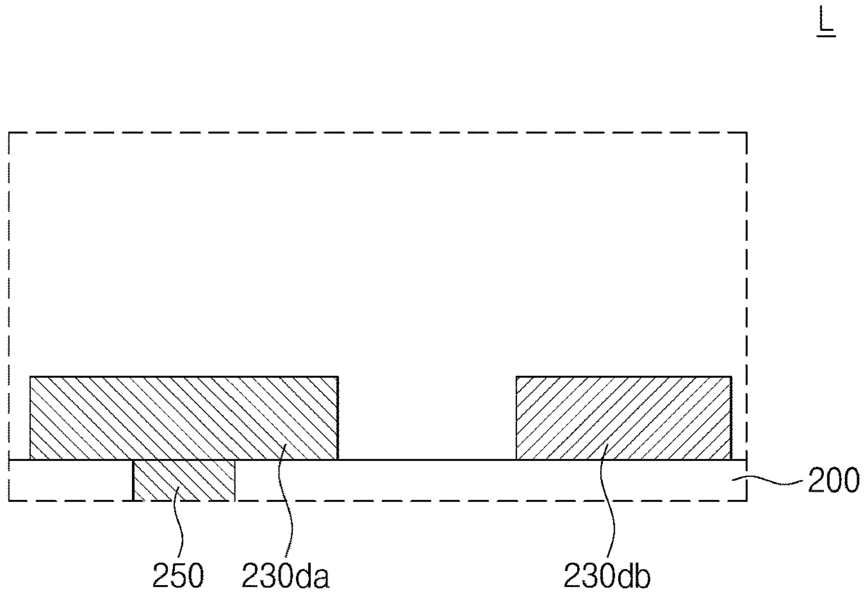

Referring to FIGS. 8, 9A, and 9B, a source and a drain may be formed on a front surface of a semiconductor substrate on a signal region SR, and a gate dielectric layer and a gate electrode may be formed between the source and the drain, which may result in formation of transistors. A dielectric layer on and at least partially covering the transistors may be formed on the semiconductor substrate, and wiring lines connected to the transistors may be formed in the dielectric layer, with the result that a second circuit layer 202 may be formed. A plurality of second lower pads 204 may be formed on one surface of the second circuit layer 202. On the signal region SR and peripheral regions PR, second vias 210 may be formed to extend into and penetrate the semiconductor substrate to connect to the second circuit layer 202 or the second lower pads 204. In other embodiments, vertical wiring lines 250 may be formed on a rear surface of the semiconductor substrate to connect to the second circuit layer 202 or the second lower pads 204. On the rear surface of the semiconductor substrate, wiring patterns 230 may be formed to couple to the second vias 210 or the vertical wiring lines 250. A second die 200 may be defined to indicate the semiconductor substrate on which are formed the second circuit layer 202, the second lower pads 204, and the second vias 210.

Figure 10A:
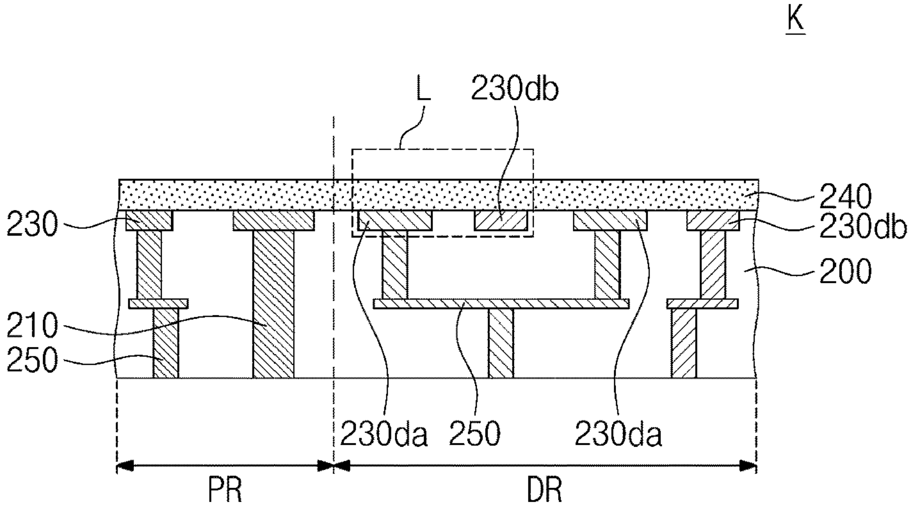
Figure 10B:
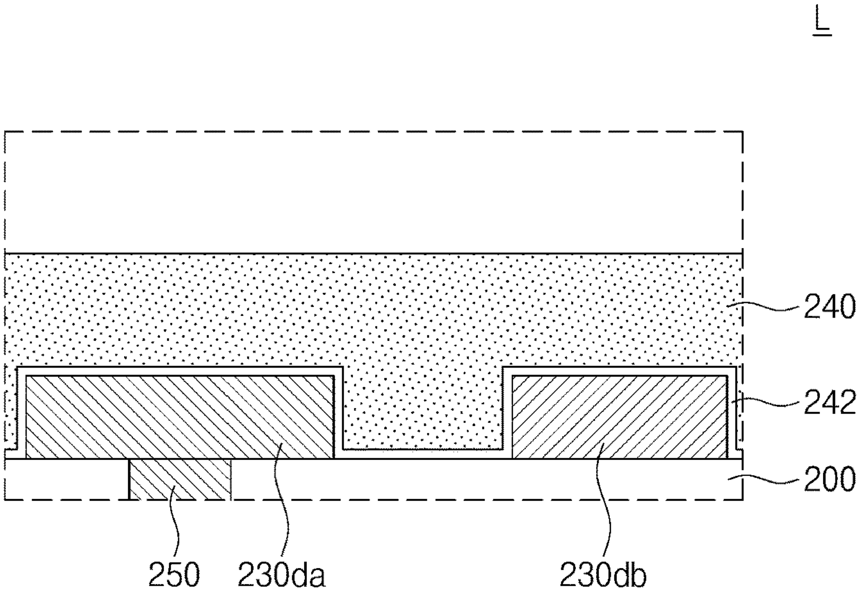

Referring to FIGS. 8, 10A, and 10B, an upper barrier pattern 242 may be formed on a rear surface (or a top surface) of the second die 200. For example, the upper barrier pattern 242 may be formed by conformally depositing a dielectric material on the wiring patterns 230 and the top surface of the second die 200.

An upper dielectric layer 240 may be formed on the upper barrier pattern 242. For example, the upper dielectric layer 240 may be formed by coating and curing a dielectric material on the upper barrier pattern 242 or by deposing a dielectric material.

Figure 11A:
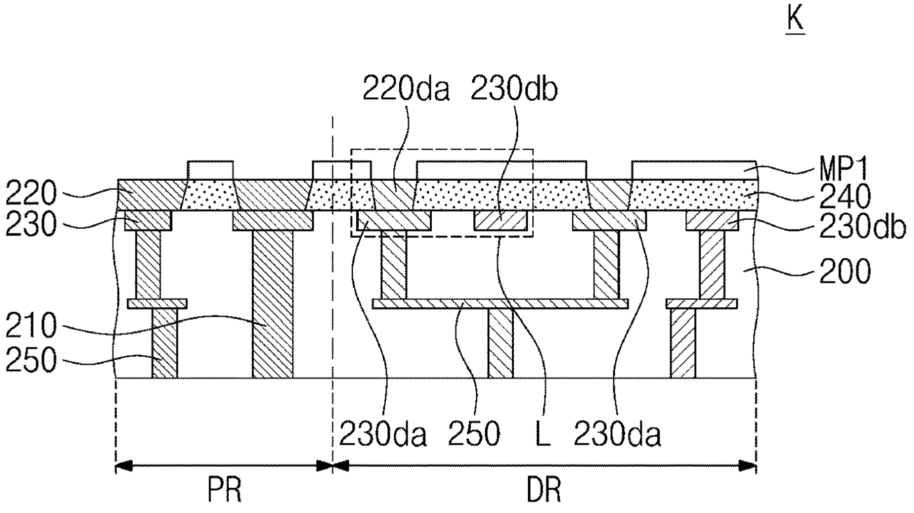
Figure 11B:
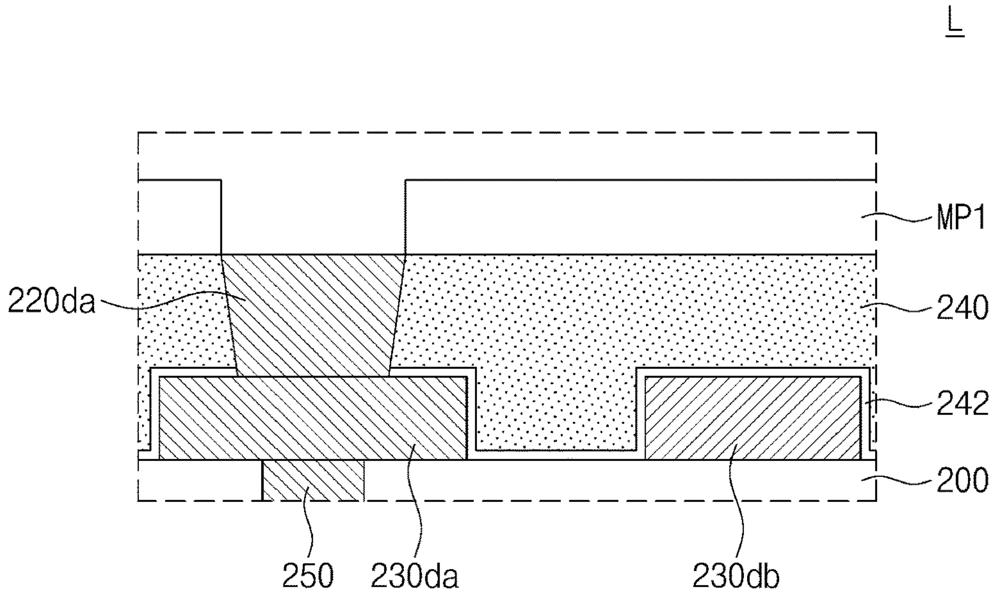

Referring to FIGS. 8, 11A, and 11B, a first mask pattern MP1 may be formed on the upper dielectric layer 240. The first mask pattern MP1 may have pattern holes positioned above the wiring pattern 230 on the peripheral regions PR and positioned above first ones **230*da* of dummy patterns 230*da* and 230*db* on a dummy region DR. The first mask pattern MP1 may have no pattern holes above second dummy patterns 230*db*. Although not shown, on the signal region SR, the first mask pattern MP1 may further have pattern holes positioned above the wiring pattern 230**.

The first mask pattern MP1 may be used as an etching mask to pattern the upper dielectric layer 240 and the upper barrier pattern 242. Therefore, openings may be formed to expose the wiring pattern 230 on the peripheral regions PR and to expose the first dummy patterns **230*da* of the dummy patterns 230*da* and 230*db* on the dummy region DR. The second dummy patterns 230*db* may be at least partially covered with the upper dielectric layer 240 and may not be exposed. Although not shown, on the signal region SR, the openings may expose the wiring pattern 230**.

The openings may be at least partially filled with a conductive material to form second upper pads 220. For example, a conductive layer may be formed to at least partially cover the first mask pattern MP1 and to at least partially fill the openings, and then the conductive layer may undergo an etch-back process to form the second upper pads 220 that remain in the openings. In other embodiments, after the first mask pattern MP1 is removed, a conductive layer may be formed to at least partially cover a top surface of the upper dielectric layer 240 and to at least partially fill the openings, and then a thinning process may be performed on the conductive layer until the top surface of the upper dielectric layer 240 is exposed. Through the process described above, the second upper pads 220 may be formed to include second power/ground pads coupled to the wiring pattern 230 on the peripheral regions PR and to include power pads **220*da* coupled to the first dummy patterns 230*da* on the dummy region DR. Although not shown, the second upper pads 220 may be formed to include second signal pads coupled to the wiring pattern 230** on the signal region SR. Afterwards, the first mask pattern MP1 may be removed.

A second die 200 may thus be formed.

A plurality of second dies 200 may be bonded to each other. FIGS. 13A, 13B, 14A, and 14B show a detailed illustration of bonding between the second dies 200, and the bonding between the second dies 200 will be described below with reference to FIGS. 13A, 13B, 14A, and 14B.

Referring to FIGS. 12, 13A, and 13B, an upper second die 200-2 may be positioned on a lower second die 200-1.

A front surface of the upper second die 200-2 may face a rear surface of the lower second die 200-1. Therefore, the second lower pads 204 of the upper second die 200-2 may be vertically (D3 direction) aligned with the second upper pads 220 of the lower second die 200-1. A bottom surface of a lower dielectric layer 207 included in the upper second die 200-2 may contact the top surface of the upper dielectric layer 240 included in the lower second die 200-1, and bottom surfaces of second lower pads 204 included in the upper second die 200-2 may contact top surfaces of the second upper pads 220 included in the lower second die 200-1.

In a process for fabricating and placing the lower second die 200-1 and the upper second die 200-2, impurities may contaminate the bottom surface of the lower dielectric layer 207 or the top surface of the upper dielectric layer 240. The impurities may include metallic materials that constitute the second lower pads 204 or the second upper pads 220. As the lower second die 200-1 contacts the upper second die 200-2, the impurities may form one layer on an interface between the lower dielectric layer 207 and the upper dielectric layer 240. Hereinafter, the layer formed of the impurities may be called an impurity layer IFO.

Referring to FIGS. 12, 14A, and 14B, the lower second die 200-1 may be bonded to the upper second die 200-2. An annealing process may be performed on the lower second die 200-1 and the upper second die 200-2. The annealing process may bond the second lower pads 204 to the second upper pads 220. For example, the second lower pad 204 and the second upper pad 220 may be combined with each other to constitute a single unitary piece. The second lower pads 204 may be automatically bonded to the second upper pads 220. For example, the second lower pad 204 and the second upper pad 220 may be formed of the same material (e.g., copper (Cu)), and may be bonded to each other by an intermetallic hybrid bonding process resulting from surface activation at an interface between the second lower pad 204 and the second upper pad 220 that are in contact with each other. The annealing process may bond the second lower pads 204 to the second upper pads 220.

In the annealing process, the impurities may diffuse along the interface between the lower dielectric layer 207 and the upper dielectric layer 240. For example, the impurity layer IFO may extend along the interface between the lower dielectric layer 207 and the upper dielectric layer 240. In particular, on the dummy region DR, the impurity layer IFO may be formed between second lower dummy pads 204*d*.

According to some embodiments of the present inventive concepts, power pads 220*da* may be formed on the first dummy pattern 230*da* connected to a power circuit of the second dies 200-1 and 200-2, and no pads may be formed on the second dummy pattern 230*db* connected to a ground circuit of the second dies 200-1 and 200-2. Therefore, the second lower dummy pads 204*d* of the upper second die 200-2 may be electrically connected to the first dummy pattern 230*da* of the lower second die 200-1 and electrically insulated from the second dummy pattern 230*db* of the lower second die 200-1. Therefore, even when the second lower dummy pads 204*d* are electrically connected to each other through the impurity layer IFO, the risk of an electrical short occurring between the ground circuit and the power circuit in the second dies 200-1 and 200-2 may be reduced. Accordingly, there may be less occurrences of failures.

FIGS. 15A to 18A are cross-sectional views of section K depicted in FIG. 8, illustrating a method of fabricating a semiconductor package according to some embodiments of the present inventive concepts. FIGS. 15B to 18B are enlarged views illustrating section L of FIGS. 15A to 18A, respectively.

Figure 15A:
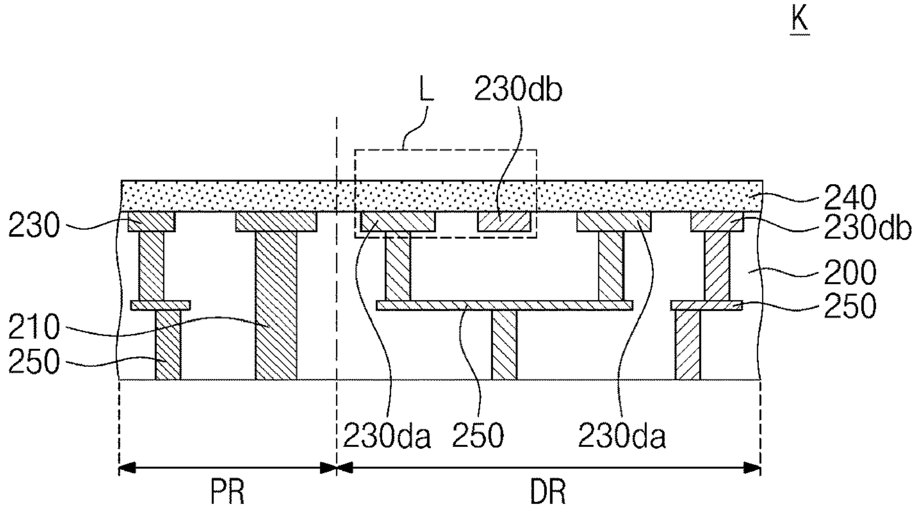
Figure 15B:
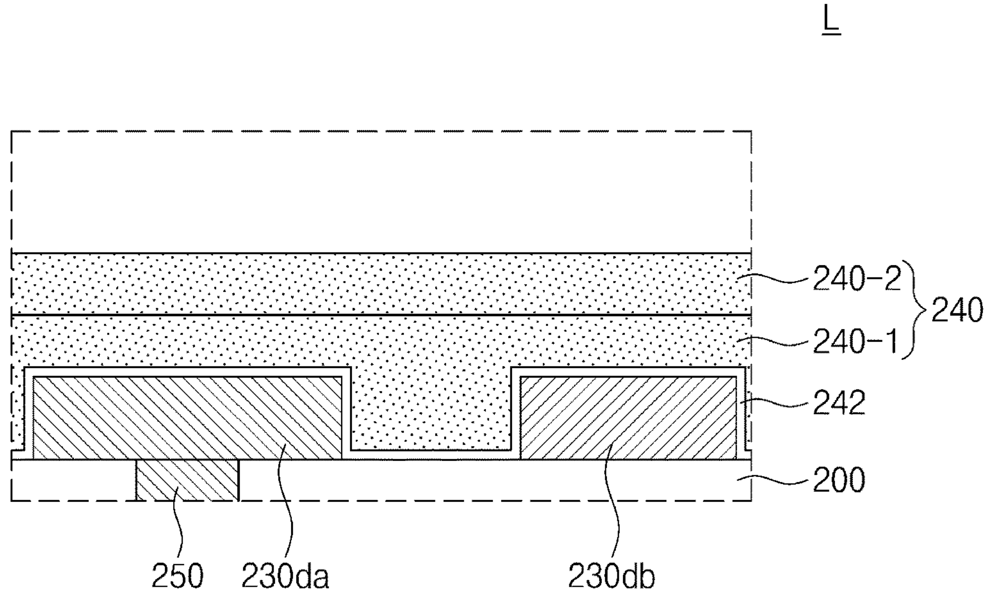

Referring to FIGS. 8, 15A, and 15B, an upper barrier pattern 242 may be formed on the top surface of the second die 200 in a resultant structure of FIGS. 9A and 9B. A first upper dielectric layer 240-1 may be formed on the upper barrier pattern 242. For example, a first dielectric material may be coated on the upper barrier pattern 242 and may then be cured to form the first upper dielectric layer 240-1, or a first dielectric material may be deposited to form the first upper dielectric layer 240-1.

A second upper dielectric layer 240-2 may be formed on the first upper dielectric layer 240-1. For example, a second dielectric material may be coated on the first upper dielectric layer 240-1 and may then be cured to form the second upper dielectric layer 240-2, or a second dielectric material may be deposited to form the second upper dielectric layer 240-2. The second dielectric material may include a material having an etch selectivity with respect to the first dielectric material. The first upper dielectric layer 240-1 and the second upper dielectric layer 240-2 may constitute an upper dielectric layer 240.

Figure 16A:
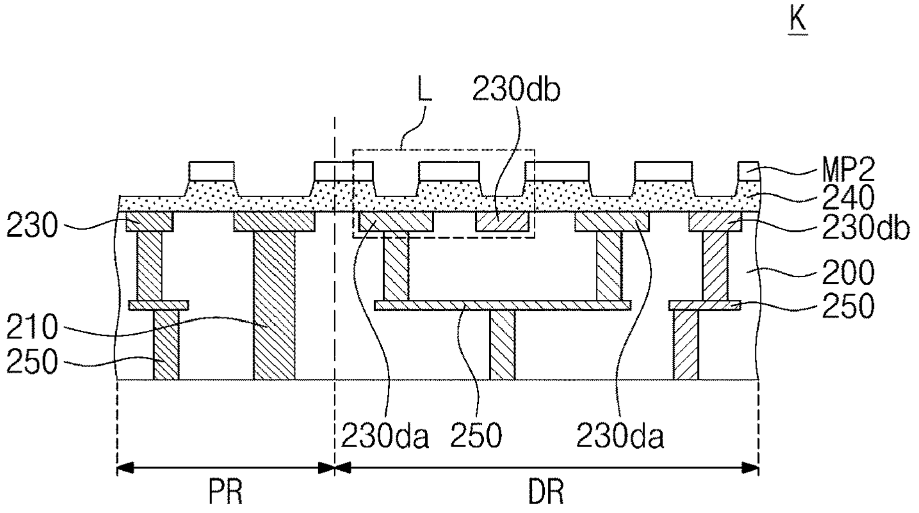
Figure 16B:
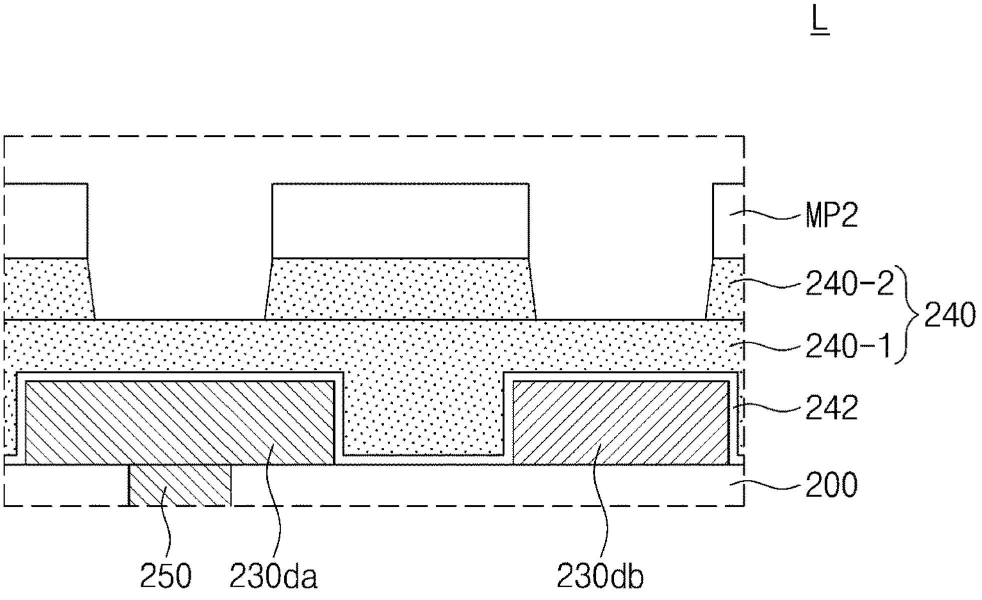

Referring to FIGS. 8, 16A, and 16B, a second mask pattern MP2 may be formed on the second upper dielectric layer 240-2. The second mask pattern MP2 may have pattern holes positioned above the wiring pattern 230 on the peripheral regions PR and positioned above the dummy patterns 230*da* and 230*db* on the dummy region DR.

The second mask pattern MP2 may be used as an etching mask to pattern the second upper dielectric layer 240-2. Thus, recesses may be formed that are positioned above the wiring pattern 230 on the peripheral regions PR and positioned above the dummy patterns 230*da* and 230*db* on the dummy region DR. The recesses may expose a top surface of the first upper dielectric layer 240-1.

Afterwards, the second mask pattern MP2 may be removed.

Figure 17A:
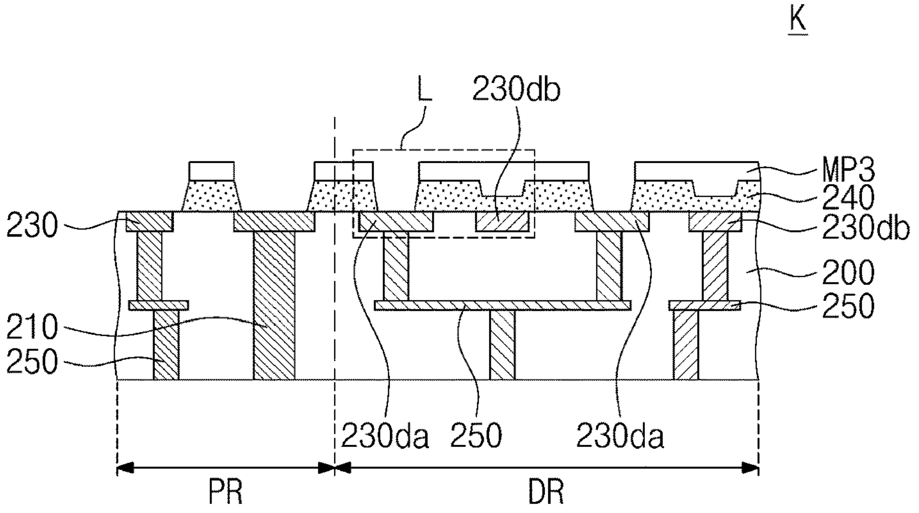
Figure 17B:
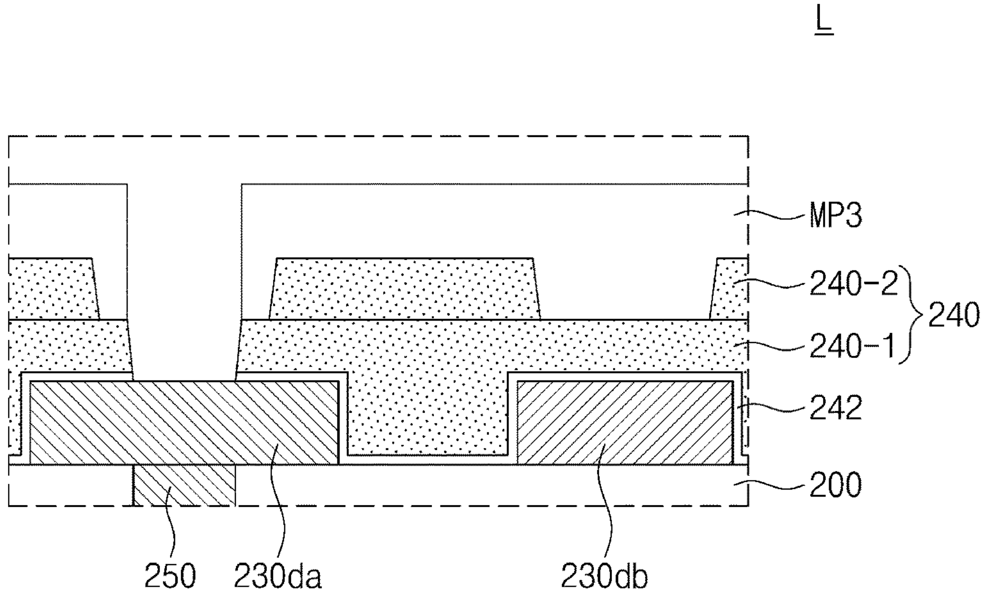

Referring to FIGS. 8, 17A, and 17B, a third mask pattern MP3 may be formed on the second upper dielectric layer 240-2. The third mask pattern MP3 may have pattern holes positioned above the wiring pattern 230 on the peripheral regions PR and positioned above first ones 230*da* of the dummy patterns 230*da* and 230*db* on the dummy region DR. The third mask pattern MP3 may have no pattern holes above the second dummy patterns 230*db*. The pattern holes may be positioned inside the recesses, and may have a width less than that of the recesses. For example, the pattern holes may expose bottom surfaces of the recesses.

The third mask pattern MP3 may be used as an etching mask to pattern the first upper dielectric layer 240-1. Thus, openings may be formed that are positioned above the wiring pattern 230 on the peripheral regions PR and positioned above the first dummy patterns 230*da* of the dummy patterns 230*da* and 230*db* on the dummy region DR. The openings may expose the top surface of the first upper dielectric layer 240-1. On the dummy region DR, the recesses may remain above the second dummy patterns 230*db* of the dummy patterns 230*da* and 230*db*.

Afterwards, the third mask pattern MP3 may be removed.

Figure 18A:
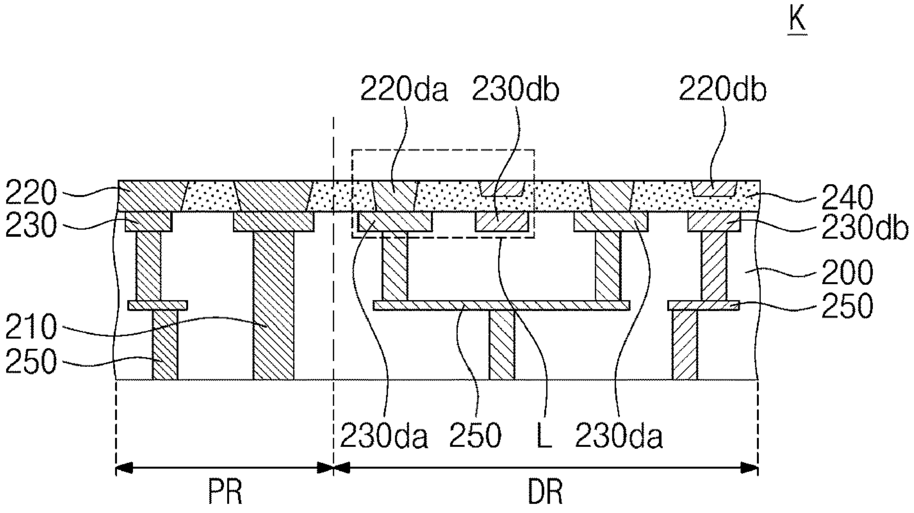
Figure 18B:
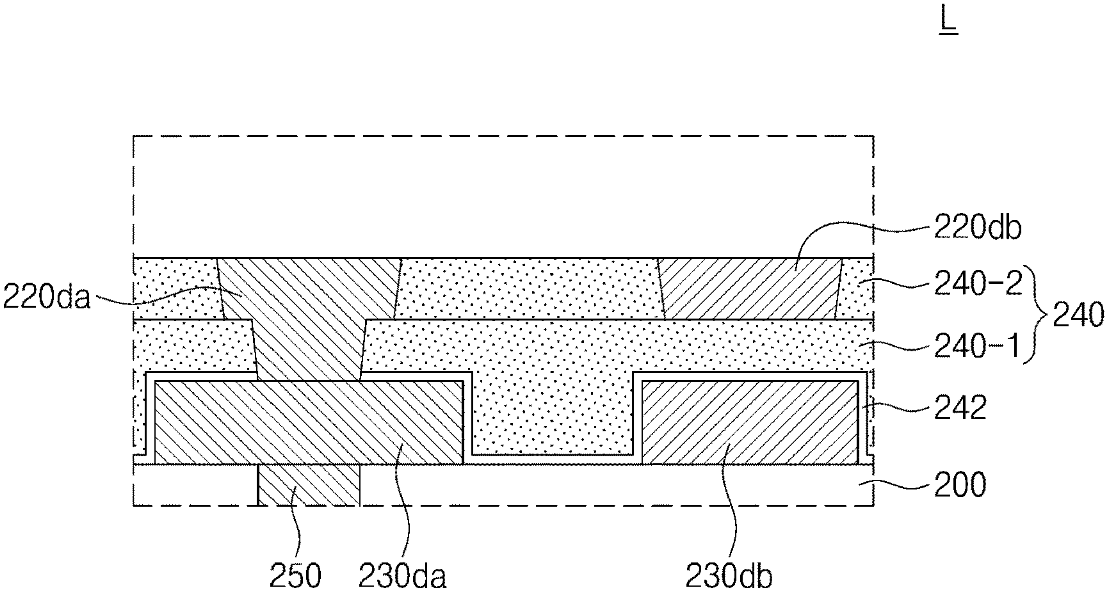

Referring to FIGS. 8, 18A, and 18B, the openings and the recesses may be at least partially filled with a conductive material to form second upper pads 220. For example, a conductive layer may be formed to at least partially cover a top surface of the second upper dielectric layer 240-2 and to at least partially fill the openings and the recesses, and then a thinning process may be performed on the conductive layer until the top surface of the second upper dielectric layer 240-2 is exposed. The process described above may form the second upper pads 220 that include second power/ground pads coupled to the wiring pattern 230 on the peripheral region PR, power pads 220*da* coupled to the first dummy patterns 230*da* on the dummy region DR, and ground pads 220*db* spaced apart from the second dummy patterns 230*db* above the second dummy patterns 230*db* on the dummy region DR.

Afterwards, the second dies 200 may be bonded to each other as described with reference to FIGS. 13A, 13B, 14A, and 14B. For example, an annealing process may be performed on the lower second die 200-1 and the upper second die 200-2. The annealing process may bond the second lower pads 204 to the second upper pads 220.

In the annealing process, on the dummy region DR, an impurity layer IFO may be formed between second lower dummy pads 204*d* or between second upper dummy pads 240*d*.

According to some embodiments of the present inventive concepts, because the ground pads 220*db* are not electrically connected to the second dummy patterns 230*db*, even when the ground pads 220*db* and the power pads 220*da* are electrically connected through the impurity layer IFO, the risk of an electrical short occurring between the ground circuit and the power circuit in the second dies 200-1 and 200-2 may be reduced. Accordingly, there may be less occurrences of failures.

FIGS. 19A to 22A are cross-sectional views of section K depicted in FIG. 8, illustrating a method of fabricating a semiconductor package according to some embodiments of the present inventive concepts. FIGS. 19B to 22B are enlarged views illustrating section L of FIGS. 19A to 22A, respectively.

Figure 19A:
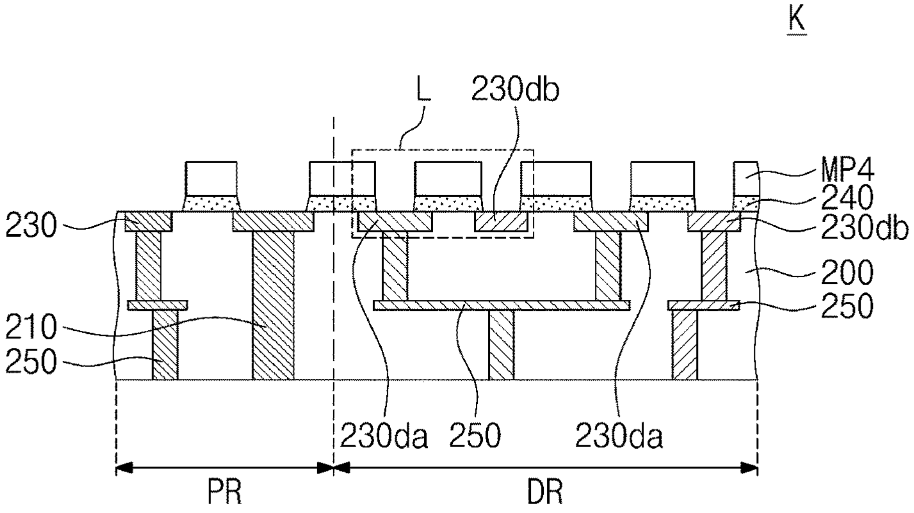
Figure 19B:
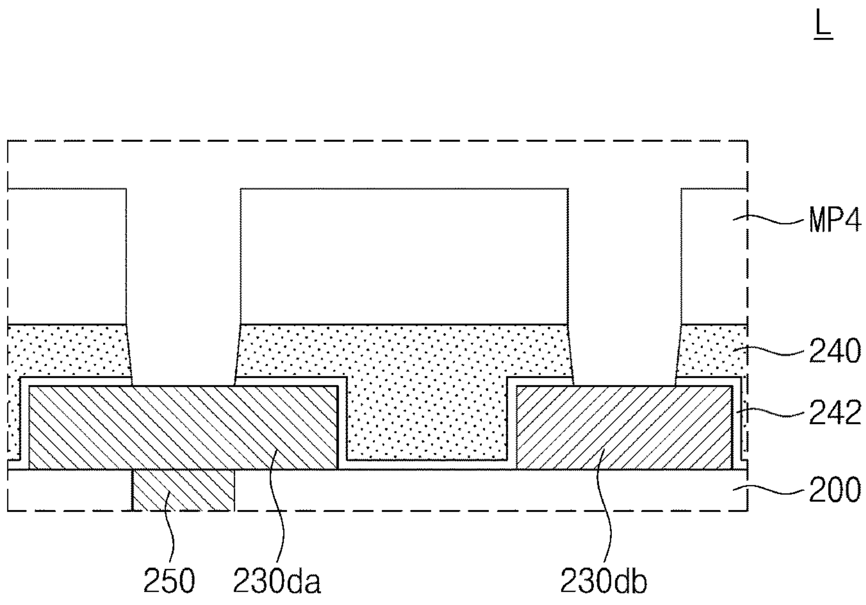

Referring to FIGS. 8, 19A, and 19B, an upper barrier pattern 242 may be formed on the top surface of the second die 200 in a resultant structure of FIGS. 9A and 9B.

A first upper dielectric layer 240-1 may be formed on the upper barrier pattern 242. For example, a first dielectric material may be coated on the upper barrier pattern 242 and may then be cured to form the first upper dielectric layer 240-1 or a first dielectric material may be deposited to form the first upper dielectric layer 240-1.

A fourth mask pattern MP4 may be formed on the first upper dielectric layer 240-1. The fourth mask pattern MP4 may have pattern holes positioned above the wiring pattern 230 on the peripheral regions PR and positioned above the dummy patterns 230*da* and 230*db* on the dummy region DR.

The fourth mask pattern MP4 may be used as an etching mask to pattern the first upper dielectric layer 240-1. Therefore, first openings may be formed to expose the wiring pattern 230 on the peripheral regions PR and to expose the dummy patterns 230*da* and 230*db* on the dummy region DR.

Afterwards, the fourth mask pattern MP4 may be removed.

Figure 20A:
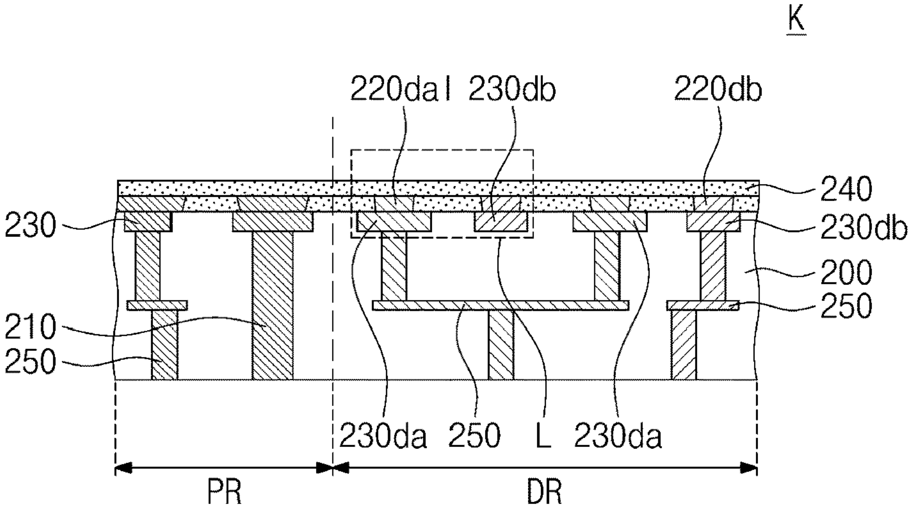
Figure 20B:
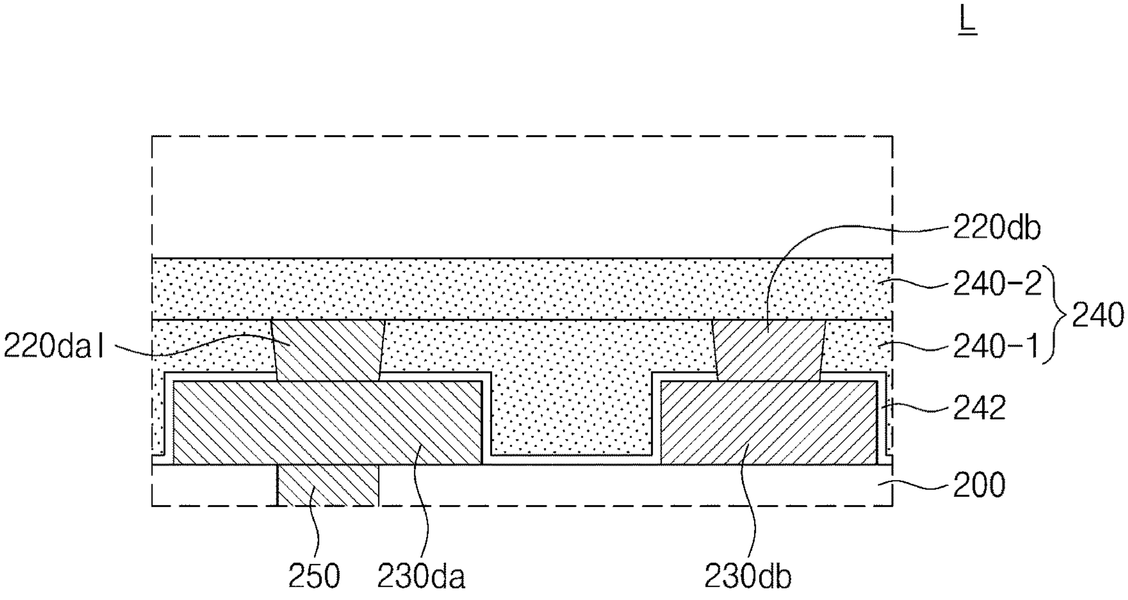

Referring to FIGS. 8, 20A, and 20B, the first openings may be at least partially filled with a conductive material to form tail parts of second upper pads 220. For example, a conductive layer may be formed to on to at least partially cover a top surface of the first upper dielectric layer 240-1 and to at least partially fill the first openings, and then a thinning process may be performed on the conductive layer until the top surface of the first upper dielectric layer 240-1 is exposed. The process described above may form the second pads 220 that include tail parts of second power/ground pads coupled to the wiring pattern 230 on the peripheral region PR, tail parts 220*da*1 of power pads 220*da* coupled to the first dummy patterns 230*da* on the dummy region DR, and ground pads 220*db* spaced apart from the second dummy patterns 230*db* above the second dummy patterns 230*db* on the dummy region DR.

A second upper dielectric layer 240-2 may be formed on the first upper dielectric layer 240-1. For example, a second dielectric material may be coated on the upper barrier pattern 242 and may then be cured to form the second upper dielectric layer 240-2, or a second dielectric material may be deposited to form the second upper dielectric layer 240-2. The first upper dielectric layer 240-1 and the second upper dielectric layer 240-2 may constitute an upper dielectric layer 240. The second upper dielectric layer 240-2 may be on and at least partially cover the tail parts of the second upper pads 220, the tail parts 220*da*1 of the power pads 220*da*, and the ground pads 220*db*.

Figure 21A:
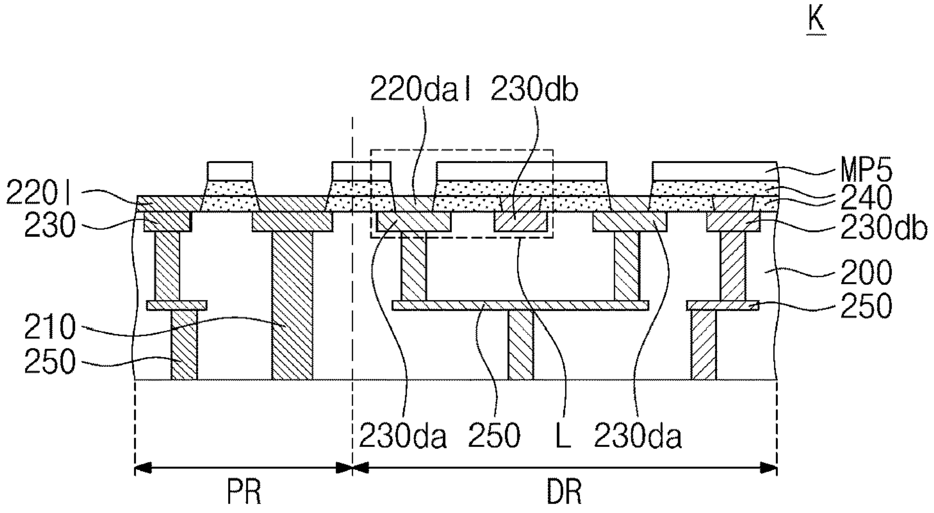
Figure 21B:
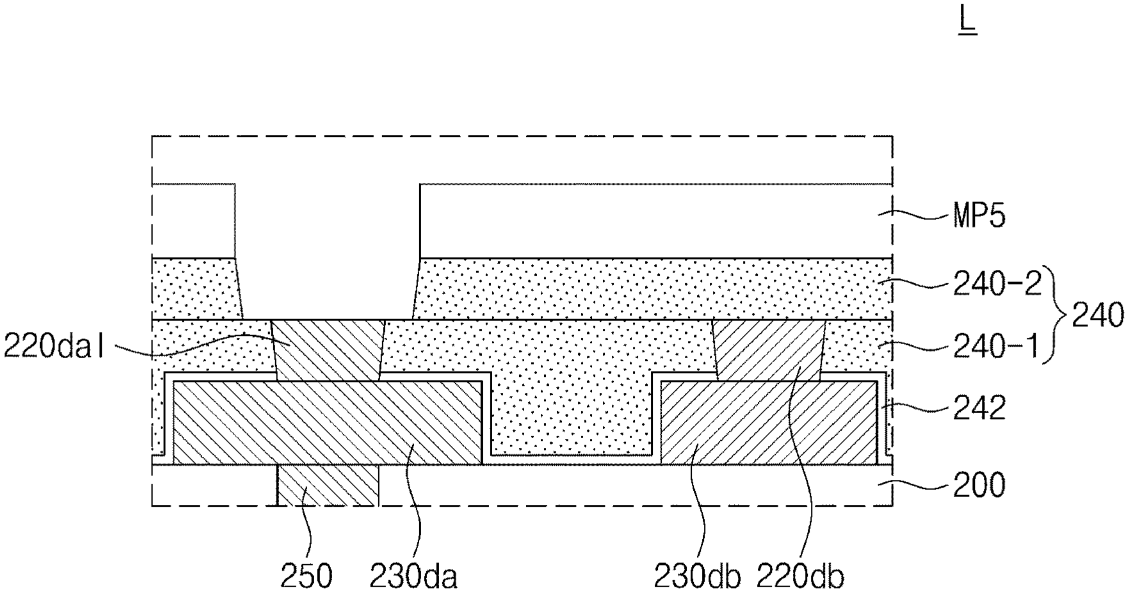

Referring to FIGS. 8, 21A, and 21B, a fifth mask pattern MP5 may be formed on the second upper dielectric layer 240-2. The fifth mask pattern MP5 may have pattern holes positioned above the tail parts of the second upper pads 220 on the peripheral regions PR and positioned above the tail parts 220*da*1 of the power pads 220*da* on the dummy regions DR.

The fifth mask pattern MP5 may be used as an etching mask to pattern the second upper dielectric layer 240-2. Therefore, second openings may be formed to expose the tail parts of the second upper pads 220 on the peripheral regions PR and to expose the tail parts 220*da*1 of the power pads 220*da* on the dummy region DR.

Afterwards, the fifth mask pattern MP5 may be removed.

Figure 22A:
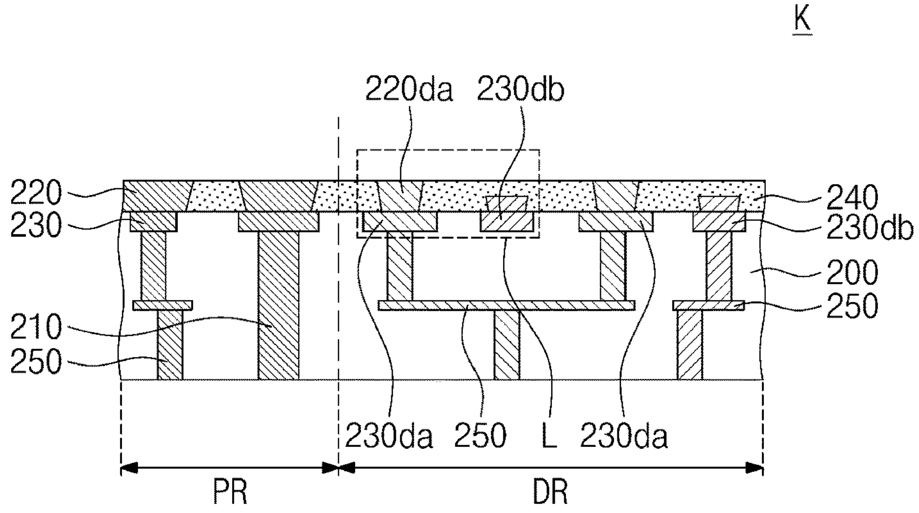
Figure 22B:
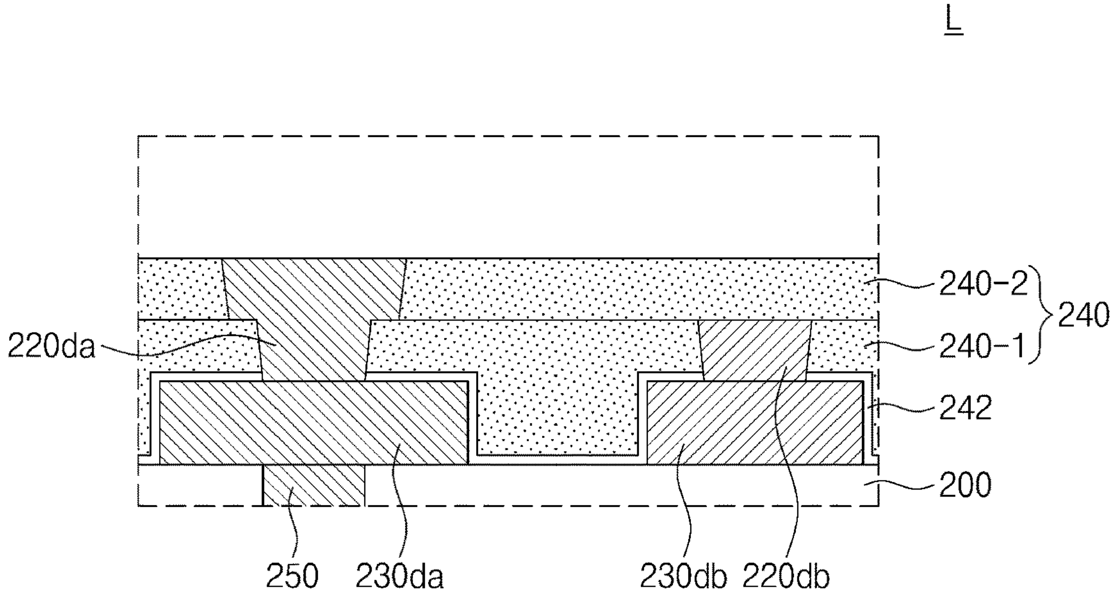

Referring to FIGS. 8, 22A, and 22B, the second openings may be at least partially filled with a conductive material to form head parts of the second upper pads 220. For example, a conductive layer may be formed to be on and at least partially cover a top surface of the second upper dielectric layer 240-2 and to at least partially fill the second openings, and then a thinning process may be performed on the conductive layer until the top surface of the second upper dielectric layer 240-2 is exposed. The process described above may form head parts of second power/ground pads of the second upper pads 220 on the peripheral regions PR and head parts of the power pads 220*da* on the dummy region DR. Therefore, the second upper pads 220 may be formed to include the second power/ground pads that are coupled to the wiring pattern 230 on the peripheral regions PR and are exposed on the top surface of the second upper dielectric layer 240-2. On the dummy region DR, the power pads 220*da* may be formed which are coupled to the first dummy patterns 230*da* and are exposed on the top surface of the second upper dielectric layer 240-2. On the dummy region DR, the ground pads 220*db* may be formed, which are coupled to the second dummy patterns 230*db* and are buried in the second upper dielectric layer 240-2.

Afterwards, the second dies 200 may be bonded to each other as discussed with reference to FIGS. 13A, 13B, 14A, and 14B. For example, an annealing process may be performed on the lower second die 200-1 and the upper second die 200-2. The annealing process may bond the second lower pads 204 to the second upper pads 220.

In the annealing process, on the dummy region DR, an impurity layer IFO may be formed between second lower dummy pads 204*d* or between second upper dummy pads 240*d*.

According to some embodiments of the present inventive concepts, the power pads 220*da* may be formed on the first dummy pattern 230*da* connected to a power circuit of the second dies 200-1 and 200-2, and no pads may be formed on the second dummy pattern 230*db* connected to a ground circuit of the second dies 200-1 and 200-2. Therefore, even when the ground pads 220*db* and the power pads 220*da* are electrically connected to each other through the impurity layer IFO, the risk of an electrical short between the ground circuit and the power circuit in the second dies 200-1 and 200-2 may be reduced. Accordingly, there may be less occurrences of failures.

In a semiconductor package according to some embodiments of the present inventive concepts, heat may be thermally radiated through upper dummy pads and dummy patterns even on a dummy region that corresponds to outer portions of dies. In addition, a lower die and an upper die may be strongly bonded to each other, and the semiconductor package may have increased structural stability. Moreover, even though lower dummy pads are electrically connected to each other through an impurity layer, the risk of an electrical short between a ground circuit and a power circuit in the dies may be reduced. As a result, the semiconductor package may increase in electrical properties and operating stability.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:

a first die having a signal region and a dummy region that surrounds the signal region in a plan view of the semiconductor package; and a second die stacked on the first die, wherein the first die includes:

a plurality of first dummy patterns arranged in a first direction on the dummy region;

a plurality of second dummy patterns on the dummy region and arranged in the first direction between the first dummy patterns;

a first dielectric layer on the first dummy patterns and the second dummy patterns; and a plurality of first pads that extend through the first dielectric layer and are coupled to the first dummy patterns, wherein the second die includes:

a plurality of second pads on the dummy region at positions that correspond to positions of the first dummy patterns; and a plurality of third pads on the dummy region at positions that correspond to positions of the second dummy patterns, wherein, on an interface between the first die and the second die, the first pads contact the second pads, wherein the first dielectric layer is between the second dummy patterns and the third pads, and wherein the first dummy patterns are connected to a ground circuit or a power circuit of the first die.

2. The semiconductor package of claim 1, wherein the first dummy patterns are connected to the power circuit of the first die, and the second dummy patterns are connected to the ground circuit of the first die.

3. The semiconductor package of claim 2, wherein, when viewed in the first direction, a width of the first dummy patterns is greater than a width of the second dummy patterns.

4. The semiconductor package of claim 1, wherein the first dummy patterns are connected to the ground circuit of the first die, and the second dummy patterns are connected to the power circuit of the first die.

5. The semiconductor package of claim 1, wherein the first die further includes a plurality of fourth pads that extend through the first dielectric layer and are coupled to the second dummy patterns, wherein the first dielectric layer is between the third pads and the fourth pads.

6. The semiconductor package of claim 1, wherein the first die further includes a plurality of fourth pads on the second dummy patterns, wherein, on the interface between the first die and the second die, the fourth pads are in contact with the third pads, and wherein the first dielectric layer is between the second dummy patterns and the fourth pads.

7. The semiconductor package of claim 1, wherein, when viewed in the first direction, a pitch between neighboring first pads is in a range of about 3 micrometers to about 30 micrometers.

8. The semiconductor package of claim 1, wherein, in the first die, two of the first dummy patterns and one of the second dummy patterns are alternately arranged in the first direction.

9. The semiconductor package of claim 1, wherein the first die further includes:

a peripheral region between the signal region and the dummy region; and a plurality of first power pads and a plurality of first ground pads on the peripheral region, wherein the second die further includes a plurality of second power pads and a plurality of second ground pads on the peripheral region, wherein the first power pads are electrically connected to the power circuit of the first die, wherein the first ground pads are electrically connected to the ground circuit of the first die, and wherein, on the interface between the first die and the second die, the first power pads are in contact with the second power pads, and the first ground pads are in contact with the second ground pads.

10. The semiconductor package of claim 1, wherein the second die further includes a second dielectric layer that surrounds the second pads and the third pads in the plan view of the semiconductor package, wherein, on the interface between the first die and the second die, the first dielectric layer and the second dielectric layer are in contact with each other.

11. A semiconductor package, comprising:

a first die having a signal region and a dummy region that surrounds the signal region in a plan view of the semiconductor package; and a second die stacked on the first die, wherein the first die includes:

a plurality of first dummy patterns and a plurality of second dummy patterns that extend in a first direction on the dummy region and are alternately arranged in a second direction that intersects the first direction;

a first dielectric layer on the first dummy patterns and the second dummy patterns;

a plurality of first pads on the first dummy patterns; and a plurality of second pads on the second dummy patterns, wherein the second die includes:

a plurality of third pads on the dummy region at positions that correspond to positions of the first pads; and a plurality of fourth pads at positions that correspond to positions of the second pads, wherein the third pads are electrically connected through the first pads to the first dummy patterns, and wherein the fourth pads are electrically insulated from the second dummy patterns.

12. The semiconductor package of claim 11, wherein the first dummy patterns are connected to a power circuit of the first die, and the second dummy patterns are connected to a ground circuit of the first die.

13. The semiconductor package of claim 11, wherein the first dummy patterns are connected to a ground circuit of the first die, and the second dummy patterns are connected to a power circuit of the first die.

14. The semiconductor package of claim 11, wherein the first dielectric layer is between the fourth pads and the second pads, and the second pads are connected to the second dummy patterns.

15. The semiconductor package of claim 11, wherein the first dielectric layer is between the second pads and the second dummy patterns, and on an interface between the first die and the second die, the second pads are in direct contact with the fourth pads.

16. The semiconductor package of claim 11, wherein, on an interface between the first die and the second die, the first pads are in direct contact with the third pads.

17. The semiconductor package of claim 11, wherein on one of the first dummy patterns, the first pads are arranged to constitute at least two rows that extend along the first direction, and on one of the second dummy patterns, the second pads are arranged to constitute one row that extends along the first direction.

18. The semiconductor package of claim 11, wherein, when viewed in the second direction, a width of the first dummy patterns is greater than a width of the second dummy patterns.

19. The semiconductor package of claim 11, wherein, when viewed in the second direction, a pitch between neighboring first pads is in a range of about 3 micrometers to about 30 micrometers.

20. A semiconductor package, comprising:

a substrate;

a first die on the substrate and having a signal region and a dummy region that surrounds the signal region in a plan view of the semiconductor package;

a second die stacked on the first die; and a molding layer on the substrate and surrounding the first die and the second die in the plan view of the semiconductor package, wherein the first die includes:

a plurality of first dummy patterns and a plurality of second dummy patterns that are alternately arranged in a first direction on the dummy region;

a first dielectric layer on the first dummy patterns and the second dummy patterns;

a plurality of first pads that are arranged to constitute at least one row that extends along a second direction on the first dummy patterns, the second direction intersecting the first direction; and a plurality of second pads that are arranged to constitute one row that extends along the second direction on the second dummy patterns, wherein the second die includes:

a plurality of third pads on the dummy region at positions that correspond to positions of the first pads; and a plurality of fourth pads at positions that correspond to positions of the second pads, wherein the first pads are in contact with the third pads and the first dummy patterns, wherein the first dielectric layer is between the fourth pads and the second pads or between the second pads and the second dummy patterns, and wherein the first dummy patterns are connected to a ground circuit or a power circuit of the first die.

* * * * *